United States Patent [19]
Chatter

[11] Patent Number: 6,108,725
[45] Date of Patent: *Aug. 22, 2000

[54] MULTI-PORT INTERNALLY CACHED DRAM SYSTEM UTILIZING INDEPENDENT SERIAL INTERFACES AND BUFFERS ARBITRATIVELY CONNECTED UNDER A DYNAMIC CONFIGURATION TO ALLOW ACCESS TO A COMMON INTERNAL BUS

[76] Inventor: Mukesh Chatter, 6 Gina Dr., Hopkinton, Mass. 01748

[ * ] Notice: This patent is subject to a terminal disclaimer.

[21] Appl. No.: 09/110,929

[22] Filed: Jul. 6, 1998

Related U.S. Application Data

[62] Division of application No. 08/581,467, Dec. 29, 1995, Pat. No. 5,799,209.

[51] Int. Cl.[7] .............................. G06F 13/00; G06F 13/36

[52] U.S. Cl. ........................... 710/56; 710/107; 710/131; 711/105; 711/119

[58] Field of Search ............................. 710/107, 56, 131; 711/105, 119

[56] References Cited

U.S. PATENT DOCUMENTS

| | | |
|---|---|---|
| 5,442,747 | 8/1995 | Chan et al. .............................. 395/164 |
| 5,457,654 | 10/1995 | McLaury ............................. 365/189.01 |
| 5,490,112 | 2/1996 | Hush et al. ......................... 365/189.04 |
| 5,550,961 | 8/1996 | Chimoto ................................ 395/133 |
| 5,581,773 | 12/1996 | Glover .................................... 395/800 |

*Primary Examiner*—Thomas C. Lee
*Assistant Examiner*—Rehana Perveen
*Attorney, Agent, or Firm*—Rines and Rines

[57] ABSTRACT

A novel low cost/high performance multi-port internally cached dynamic random access memory architecture called 'AMPIC DRAM', and consequentially a unique system architecture which eliminates current serious system bandwidth limitations, providing a means to transfer blocks of data internal to the chip, orders of magnitude faster than the traditional approach, and with the chip also interconnecting significantly higher numbers of resources with substantially enhanced performance and at notably lower cost. Through use of a system configuration based on this novel architecture and working equally efficiently for both main memory functions and as graphics memory, thus providing a truly low cost, high performance unified memory architecture.

15 Claims, 27 Drawing Sheets

RAS_BANK

RAS_BANK2

WRITE_BANK1

READ_BANK2

DATA DIRECTION
BANK2 > BANK1

Fig.15.

NOTE:
1,#2,#3,#4 ARE SERIAL DATA INTERFACES
5,#6, #7,#8 ARE DEFINED AS CONTROL INTERFACES

NOTE:
1, #2, #3, #4 ARE SERIAL DATA INTERFACES
5 IS DEFINED AS CONTROL INTERFACE

MULTI-PORT INTERNALLY CACHED DRAM SYSTEM UTILIZING INDEPENDENT SERIAL INTERFACES AND BUFFERS ARBITRATIVELY CONNECTED UNDER A DYNAMIC CONFIGURATION TO ALLOW ACCESS TO A COMMON INTERNAL BUS

This application is a division of U.S. patent application Ser. No 08/581,467, filed Dec. 29, 1995 and allowed Mar. 22, 1998, now U.S. Pat. No. 5,799,209.

The present invention relates to dynamic random access memory technology (DRAM), being more specifically directed to novel DRAM system architectures that eliminate current system bandwidth limitations and related problems and provide significantly enhanced system performance and at reduced cost, enabling substantially universal usage for many applications as a result of providing unified memory architecture.

A vast number of such system designs, especially in networking/communications, are performance-limited due to contentions among various resources to access the system main memory (almost always DRAMs). The large number of contentions is a direct result of the use of a single bus architecture where a bus interconnects the CPU, the main memory and the I/O resources. This and similar past and current architectures also retard the capability of the CPU to manage much greater numbers of I/O interfaces, due to serious bandwidth limitations.

Similar system bandwidth limitations have also caused graphics/multimedia designers to separate the graphics memory from the main memory, thereby adversely affecting the system cost. Specialized DRAMs for graphics applications have also been developed further to enhance video-data bandwidth capabilities. While some system architectures using various types of DRAMs have been proposed which will allow a common memory to be used as both main memory and graphics memory, such have had limited success because of inefficiency for one operation or another.

Thus the availability of a low cost, high performance unified memory architecture has largely remain elusive until the advent of the present invention that provides an innovative DRAM architecture and consequentially a unique System Architecture later described, which largely eliminates these problems and as a result provides considerably more data bandwidth capability to interconnect significantly higher numbers of resources and with substantially enhanced performance, at notably lower cost. A system configuration based on this novel architecture will work equally efficiently for both main memory function and as graphics memory, thus further achieving a truly low cost, high performance unified memory architecture. This chip solution has been hence named 'AMPIC DRAM', standing for A Multi Port Internally Cached DRAM.

BACKGROUND OF INVENTION

As before discussed, most of the high performance systems of this character tend to use bus-based architecture, where a system bus interconnects the CPU, the main memory and the I/O resources as shown in later-described FIG. 1, (the terms 'main memory' and 'system memory' as herein used, being so used interchangeably). This is relatively straight forward design and provides room for expansion; but it has serious limitations. Whenever the CPU or the peripherals need to access the main memory (generally implemented with DRAM), an arbitration takes place for access to the system bus. Thus the amount of concurrent activity in the system is limited by the overall capacity of the external bus.

As the speed of the CPU OR I/O Resource increases, the system bus bandwidth must correspondingly increase to realize the full potential of the system. Increasing the bus bandwidth, however, is much more difficult and very costly to the point of becoming technically impossible or prohibitively expensive. In addition, the number of I/O resources which can be on the bus is also limited by the bandwidth. It should be noted indeed that while theoretically the single bus allows a high order of expandability, the real operation due to contentions, drastically limits such expansion.

This problem is prevalent among all types of applications. While illustrative networking and graphics applications are presented hereafter as examples for better understanding of these problems, the invention is in no way limited to these exemplary areas only.

A Networking Application Example

A typical networking equipment (also called interconnectivity equipment) such as switches, routers, bridges, hubs, etc. interconnect multiple networks such as ATM, SONET, Token Ring, FDDI, Ethernet, Fiber Channel, etc. as shown in later-described FIG. 2. A typical design includes a high performance CPU and a large amount of main memory generally implemented with the use of a traditional DRAM as represented in later-described FIGS. 3 and 4. Data from various networks is transferred to the main memory in the form of cells or packets (a packet is a collection of bytes), processed by the CPU or dedicted hardware and then, in general, forwarded to their respective destination networks.

All the networks mentioned above (ATM, SONET, Fiber Channel, Token Ring, FDDI, etc.) provide different means of transporting data from one point to another. They differ in hardware, software protocol and data transfer speeds. Interconnect equipment is required to allow the users on one of these networks to communicate with users on another network with different protocol, seamlessly.

In a typical interconnectivity equipment, the network interfaces are implemented with a network interface controller (also commonly known as network controller), unique for each type of interface. Thus Ethernet has a different network interface than for Fiber Channel or ATM (FIGS. 3 and 4).

In the example presented in FIG. 4, exemplary only to explain a typical dataflow of this illustrative system configuration, the following typical parameters may be involved:

a. the system bus is 32 bit wide (4 bytes);

b. four traditional DRAMs, 2M×8 have been configured as 2M×32;

c. there are four network interfaces Fiber Channel, ATM, Ethernet, and FDDI; and d. the packet size is 1024 bytes.

Consider the case, when a packet is sent by a user on, for example, the Ethernet network to a user, for example, on the FDDI network. This packet is received by the interconnect equipment Ethernet interface controller and is analyzed by the controller chip, with only the relevant information content stored in its conventional local FIFO(First In First Out) memory, for subsequent transfer to the main memory. As there are multiple devices on the system bus including the CPU and various network controllers, arbitration takes place among all the active resources to acquire the system memory bus. After the Ethernet controller acquires the bus via arbitration, data is then forwarded to the system memory using the 32 wide system bus interface. As there are 1024 bytes in the packet and 4 bytes are transferred to the main memory per transfer, 256 such transfers are required to move the packet. If the network controller is permitted to make only one 4 byte transfer for every acquisition of the bus, minimum 256 arbitration cycles are also be required. (The number of arbitrations may be smaller if burst transfer capability is provided by the network controller. As an example, a 16 byte burst transfers capability for every acquisition, needs minimum 64 arbittration cycles).

After this packet is stored in the main memory, it is processed by the CPU (primarily the header information) and redirected towards the FDDI port, in this example. Now the reverse process takes place. The data is picked up by the FDDI interface controller from the main memory and transferred to the chip internal FIFO memory. This also requires 256 transfers and a corresponding number of arbitrations. Data is then concurrently transferred from the FDDI controller chip to its network.

FDDI operates at 100 mega bits per second, Ethernet at 10/100 mega bits per second, ATM for example at nearly 600 mega bits per second, Token ring at 16 mega bits per second, and Fiber Channel at 800 mega bits per second.

The large number of transfers and the time spent in arbitration consume a significant part of the available data bandwidth and also reduce the CPU access frequency. As the number of network interfaces increases or higher speed interfaces are added, the amount of time available to each resource, including CPU, decreases, thus clipping the peak performance of the system. It also forces the designers to go for even higher performance CPUs and associated expensive components, thus driving up the cost. The number of networks which can be connected via this prior art type of system bus also remains low due to these severe limitations, and this problem becomes worse as more and more networks at higher and higher speeds are added to accommodate, for example, the Internet related expansion activity, and is unscalable approach.

A Graphics/Multimedia Application Example

Using, again for illustrative background purposes, a graphics/multimedia application, there are two major memory related functions in such graphics systems;

a. updating the screen memory for the picture to be displayed, and b. retrieving the screen memory at very high rates to update the Cathode Ray Tube (CRT) or other screen display.

The first task requires a large number of frequent data transfers, called 'BitBlt', from one place in the memory to another; but this requirement tends to be bursty in nature. This consumes a considerable portion of the system bandwidth and thus has necessitated the use of separate memory to store graphics data, as shown in later-described FIG. 5, thereby adversely affecting the system cost. Consider an example where 16 rows of the screen memory need be updated and conventional 2M×8 DRAM components are used. To transfer 16 rows worth of data in the new location, the number of data transfers required are:

Number of Rows to be transferred (16)×Number of Columns in each row (1024)=16,384.

Obviously a corresponding number of arbitrations also needs to be made for the system bus. This large number of transfers, moreover, is required in a short time, thus consuming most of the available data bandwidth in a small time slot, starving the CPU and other I/O resources. Before the present invention, however, no practical breakthrough has been offered in this area by the existing DRAM manufacturers to alleviate this problem.

Repeated screen memory retrieval, of course, is necessary to load and refresh the CRT display, and depending on the type of display (VGA, super VGA etc.), the bandwidth requirements for such update vary, but tend to be in the order of hundred megabytes or above per second. Unlike 'BitBlt', the CRT update requirements are continuous in nature and, similar to 'BitBlt', also utilize the system bandwidth considerably.

As an example, consider the following case:

a. display size 1024×768 pixels;

b. non interlaced—updated 72 times a second; and c. 8 bits per pixel for each of the three Red, Green and Blue colors.

The bandwidth required in terms of bytes per second is:

1024×768×72×8×$\frac{3}{8}$=170 MBytes.

It is a significant requirement which is difficult to meet with the conventional DRAM, if also used as main memory. This, therefore, led to the development of more expensive specialized DRAMs and one of the popular and extensively used such special DRAM is 'Video DRAM' also called 'VRAM'. Most of the VRAMs are dual port with some exceptions where a third port has been added. A typical VRAM has a system interface similar to the traditional DRAMs, but it also has a row wide buffer (called SAM—Serial Access Memory) inside the chip, which interacts with the outside world via separate but equal number of data pins as available for the system interface as shown in later-described FIG. 6. As an example, a 256K×8 VRAM also has an additional port which is 8 bits wide to stream refresh data to the CRT continuously. The 'SAM' buffer has a fix connection with the external display interface. In operation, the CPU (or the system bus master) accesses the VRAM via the system data interface and a screen image is stored or updated in the VRAM. Then the screen data of one entire row is moved to the 'SAM' buffer in one access. This data is then subsequently transferred to the display via the SAM I/O interface, identical in width to the system interface.

Such VRAMs provide an acceptable solution for the case where the design has to interact with only one graphics source/destination. They are, however, more expensive than traditional DRAMs due to the larger number of additional pins and the bigger silicon die, and the architecture provides a very rigid structure. Expandability to more interfaces with more devices is severely limited as the number of pins grows significantly. The 'SAM' connection to the external I/O interface is fixed and the data port size is also predetermined. This approach requires CPU intervention, limiting the switching speed and also does not solve the problem of speeding the huge data movement requirements. Thus the VRAMs provide an acceptable solution but only because of lack of any better alternative, until the present invention.

VRAMs (specifically the 3 port version) were also occasionally touted towards networking applications but have rarely been so used due to their before-stated rigid I/O structure, very limited capability to interconnect number of resources (to be precise—only two) and to handle both large and small packets efficiently, bigger board space, more expensive construction and higher power consumption.

State of The Art in System Configurations & Associated Problems

In summary, therefore, the typical prior art and current system configurations based on traditional DRAMs (such as before-mentioned FIG. 3) are burdened with the limitations described above. The problems associated with the networking applications, where a large number of high speed networks need be interconnected at low cost, have remained largely unsolved, thus resulting in higher price per network interfaces.

While the system bandwidth limitations and the constant CRT display update requirements led to the development of video DRAMs, primarily intended for graphics applications and generally used in configurations such as shown in FIG. 6, as previously discussed, and while this configuration performs better than compared to the traditional DRAMs, as performance requirements on both the main memory and the display data bandwidth increased, the deleterious side effect of this configuration added cost to the system due to separation of main memory from graphics memory and also due to the higher cost of the VRAMs themselves.

Another type of a prior art graphics DRAM was also developed by RAMBUS Corporation dubbed 'RDRAM', which operates at 250 Mhz, and works fine for the graphics applications and may even be more cost effective for high end graphics/multimedia environment than VRAMs; but this approach still requires the retention of two separate buses.

In the PC market (60% of all the chips are consumed by this segment), cost is of paramount importance. A search then was initiated to find a configuration dubbed 'Unified Memory Architecture', which will share the common bus for both graphics and main memory functions and consume only one type of memory device.

One possibility is to use VRAMs as both the graphics and the main memory components; but the added cost of the components neutralizes the gains achieved by having a common memory. Another potential solution is to use the before-described RDRAM, which has a smaller number of pins per chip than VRAM, thus resulting in lower power consumption, smaller real estate and relatively lower cost. But unfortunately because of their block-oriented protocol and interface limitations, it is highly inefficient with non-localized main memory accesses, and thus does not render itself well to the concept of 'Unified Memory Architecture'. Use of RDRAM also poses a host of significant electrical engineering design challenges related to the emissions, noise interference and PCB layout, making the design task very difficult.

Thus the search has still been on for a more viable low cost/high performance unified memory architecture capable to meet the diversified requirements of both the main and the graphics memory accesses, equally efficiently.

It is to the effective solution of this pressing problem, indeed, that the present invention is directed, the invention being believed to be a breakthrough in the evolution of a new type of DRAM architecture and method that:

a. provides much higher system data bandwidth with architectural innovations rather than sheer device speeds;

b. switches the large amount of data amongst multiple I/O resources with minimum impact on the system bandwidth and with expandability;

c. interconnects considerably larger numbers of I/O resources compared to the traditional approaches;

d. moves large blocks of data internal to the chip in at least an order of magnitude faster time frame and with negligible impact on the system bandwidth;

e. is configurable to accommodate different data transfer rates of the I/O resources f. reduces the latency time between the reception of incoming packet and its subsequent transmission;

g. provides low pin count;

h. provides reasonable cost;

i. provides for low power consumption;

j. provides a simple system interface to minimize the design effort, and k. works equally efficiently for both the main memory and the graphics requirements, thus providing a truly 'Unified Memory Architecture' and substantially universal approach.

OBJECTS OF INVENTION

An objective of the invention accordingly, is to provide a new and improved dynamic random access (DRAM) system, architecture and method utilizing a novel multi-port internally cached DRAM structure that obviates current system bandwidth limitations and related problems, while providing significantly enhanced system performance at reduced cost, and which thereby enable substantially universal usage for myriads of applications.

A further object is to provide such a novel system in which the transfer of blocks of data internal to the chip is an order of magnitude faster than traditional approaches, and with the facility to interconnect significantly higher numbers of resources with substantially enhanced performance and at notably lower cost.

Still a further object is to provide a system configuration based on this novel architecture that works equally efficiently in both main memory functions and as graphics memory—a truly high performance unified memory architecture.

Other and further objectives will be explained hereinafter and are more particularly delineated in the appended claims.

SUMMARY

In summary, however, from one of its viewpoints, the invention embraces for use in a system having a master controller such as a central processing unit (CPU) having parallel data ports and a dynamic random access memory (DRAM) each connected to and competing for access to a common system bus interface, an improved DRAM architecture comprised of a multi-port internally cached DRAM (AMPIC DRAM) comprising a plurality of independent serial data interfaces each connected between a separate external I/O resource and internal DRAM memory through corresponding buffers; a switching module interposed between the serial interfaces and the buffers; and a switching module logic control for the connecting of the serial interfaces to the buffers under a dynamic configuration by the bus master controller, such as said CPU, for switching allocation as appropriate for the desired data routability.

Further, in summary, from the point of view of the internal AMPIC DRAM and its interaction with the I/O resources, the inventive feature stressed in the present divisional application embraces for use in a system for controlling data-accessing of a common bus, an improved DRAM architecture comprising a multi-port internally cached DRAM (AMPIC DRAM) comprising a plurality of independent serial data interfaces each connected between a separate external I/O resource and internal DRAM memory through corresponding buffers competing for access to a common internal bus; a switching module interposed between the serial interfaces and the buffers; and a switching module logic control for the connecting of the serial interfaces to the buffers under a dynamic configuration of switching allocation as appropriate for the desired data routability among the interfaces.

Preferred and best mode designs and techniques are hereafter explained in detail.

DRAWINGS

The invention will now be described in convention with the appended drawings, in which FIGS. 1–6 illustrate prior art techniques as follows:

FIG. 15 shows the sequence of operations of the PRITI transfers with internal data transfer from the two banks;

Figure 19:
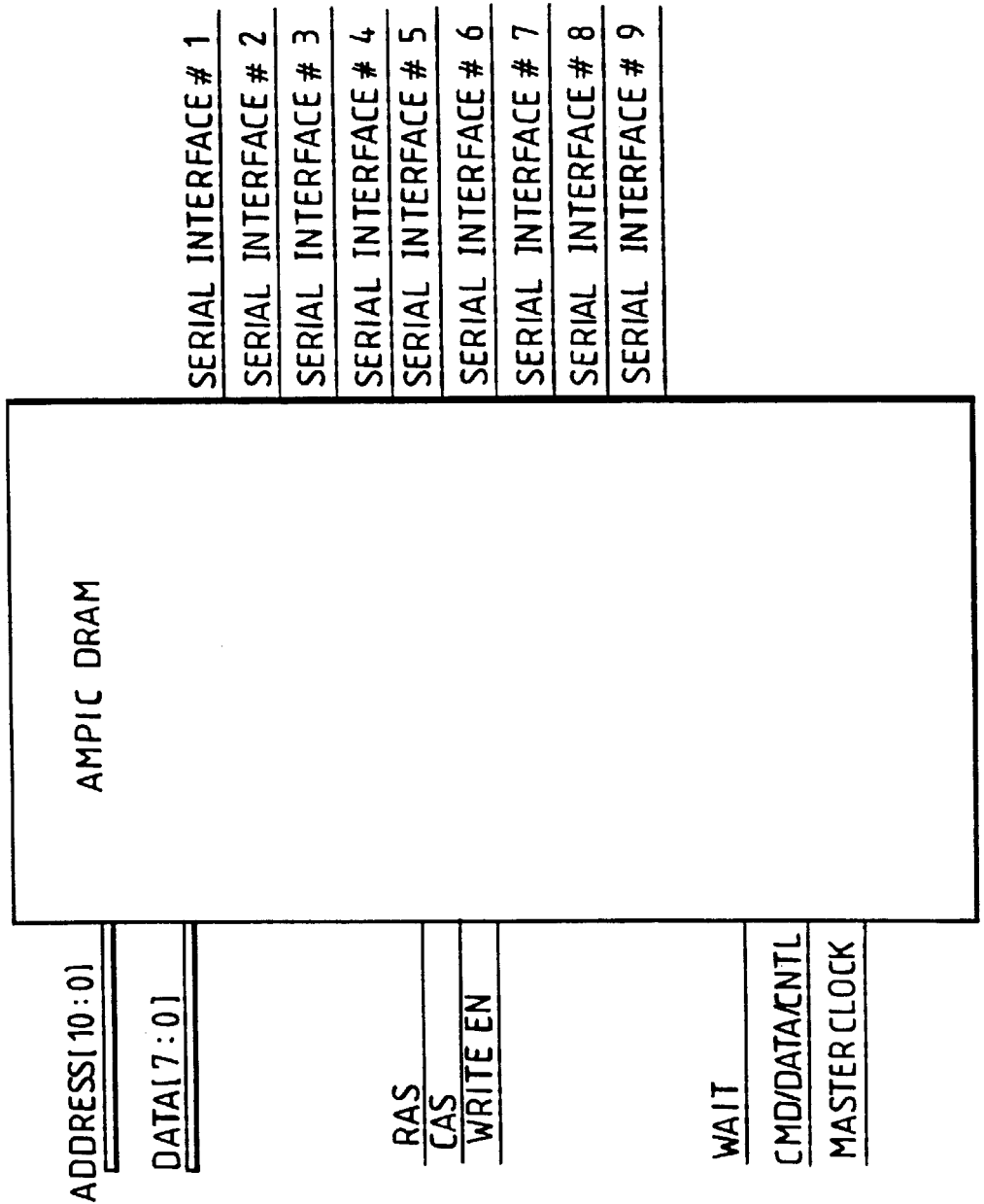
Figure 20:
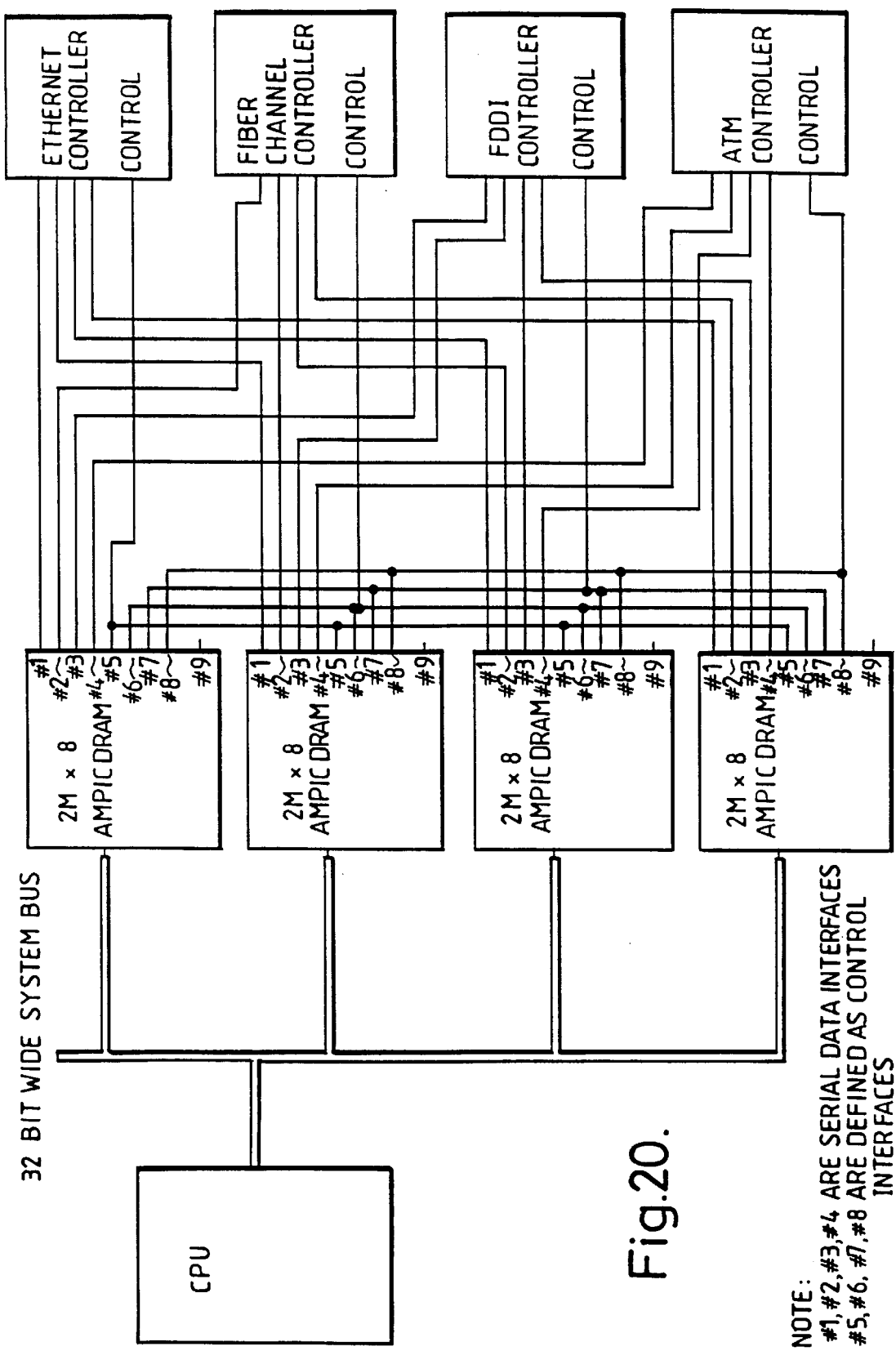
Figure 21:
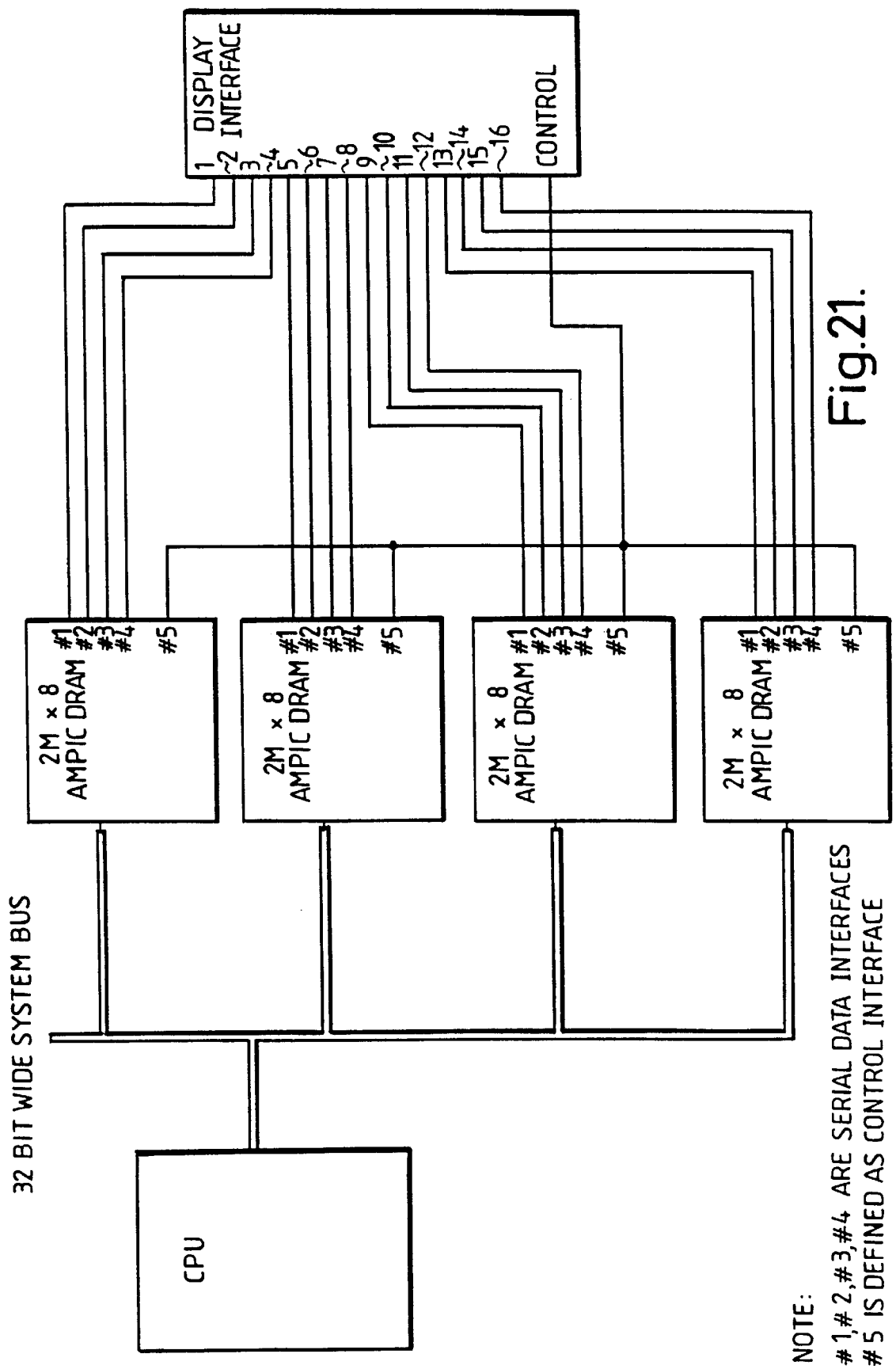
Figure 22:
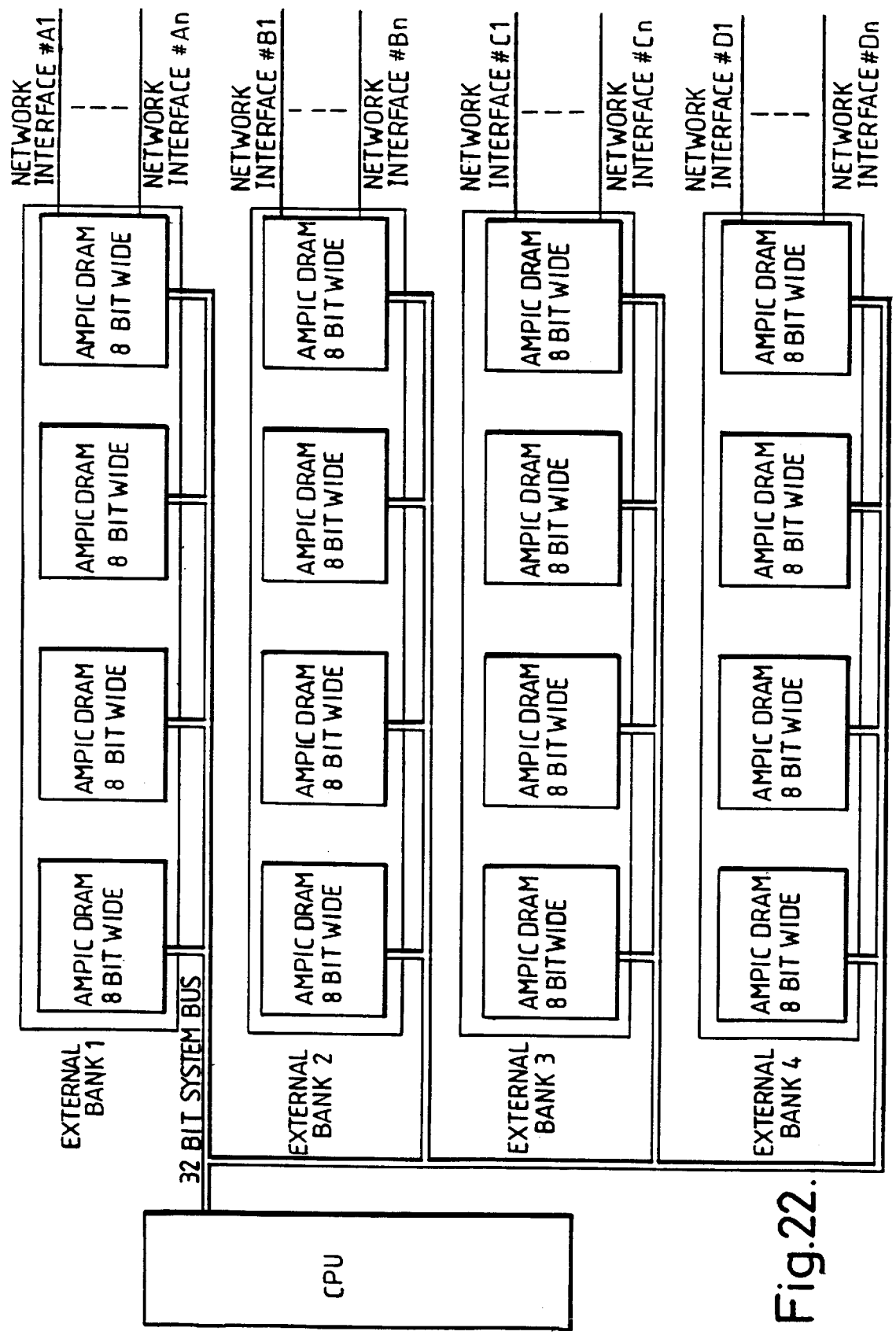
Figure 23:
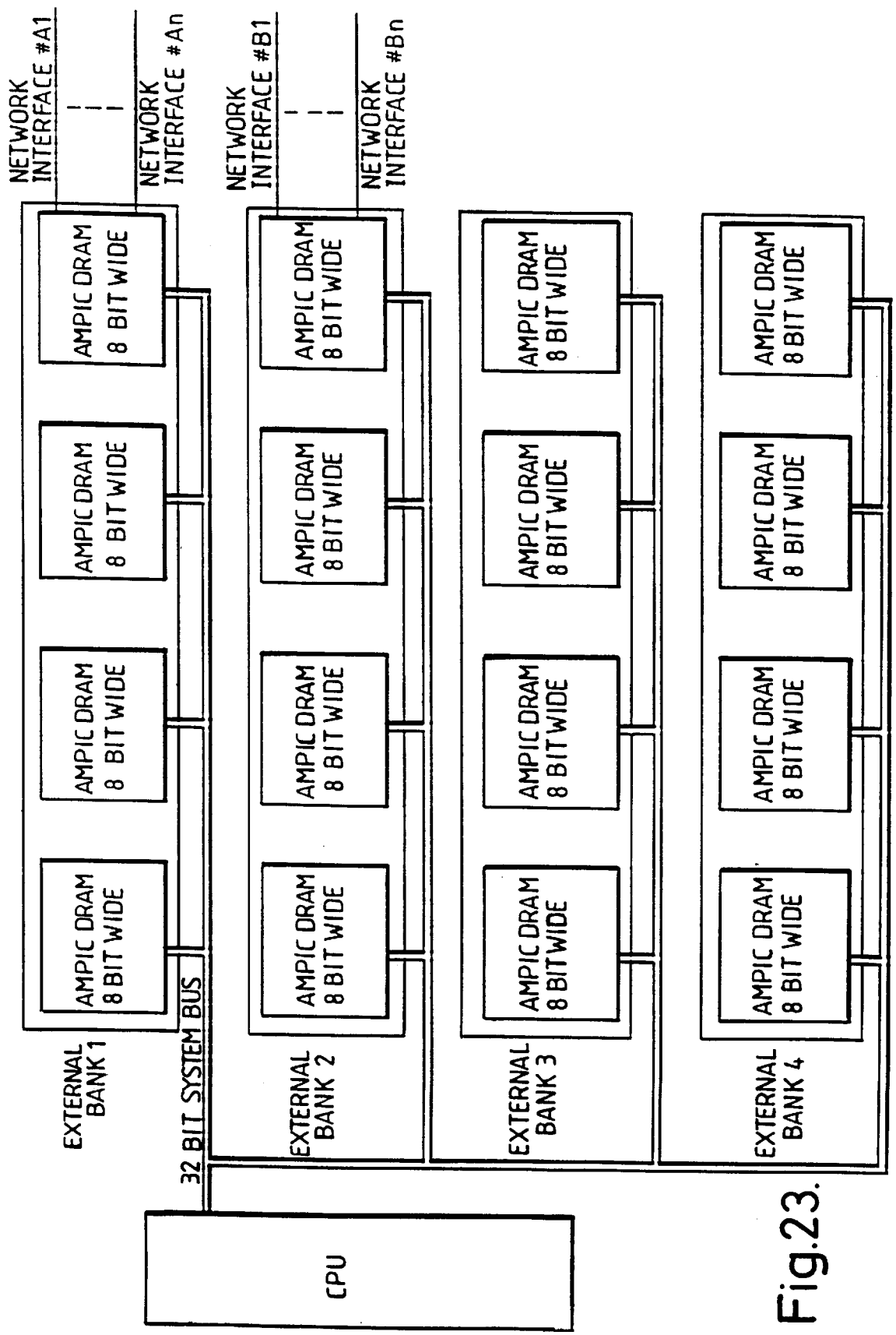
Figure 24:
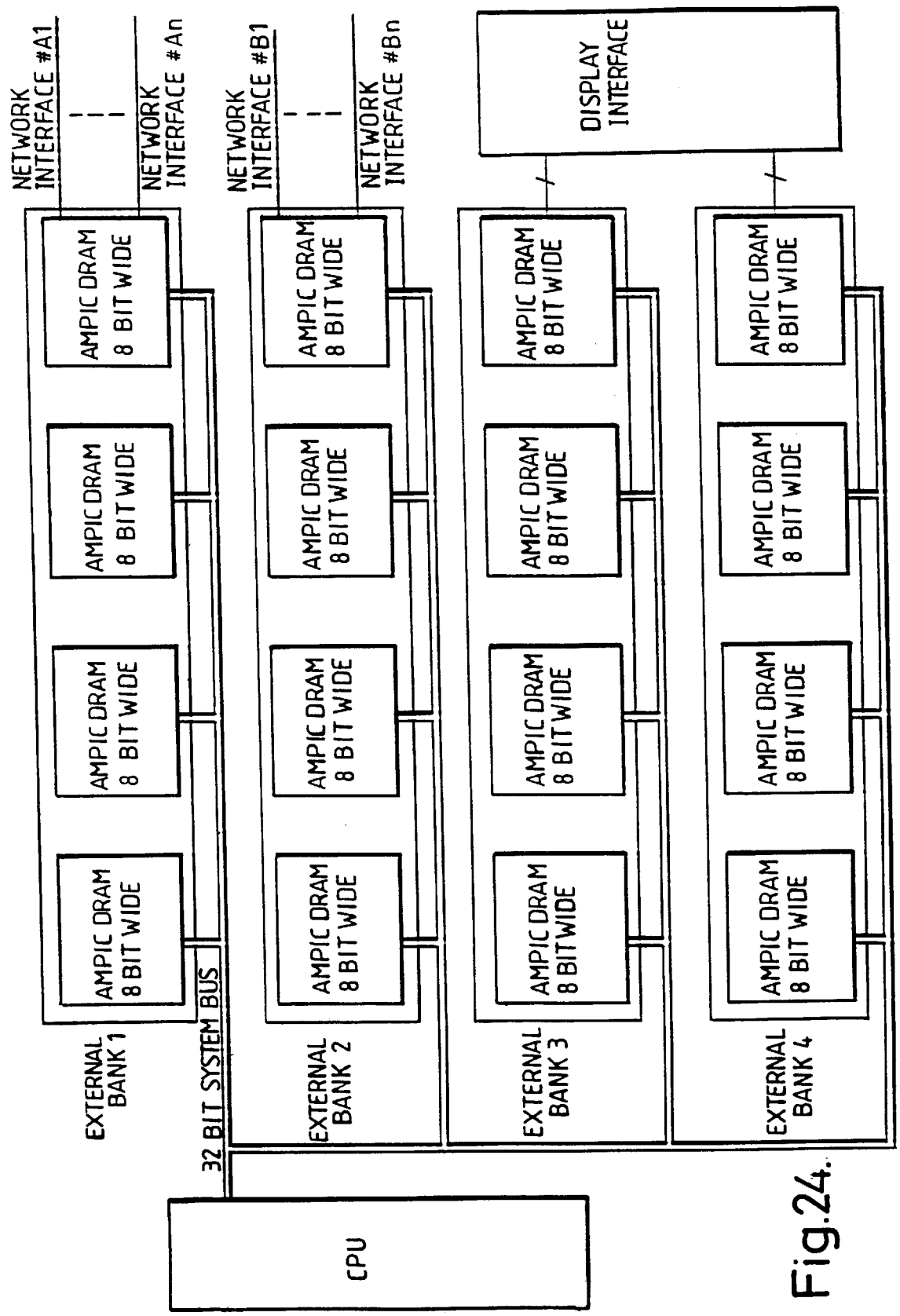
Figure 25:
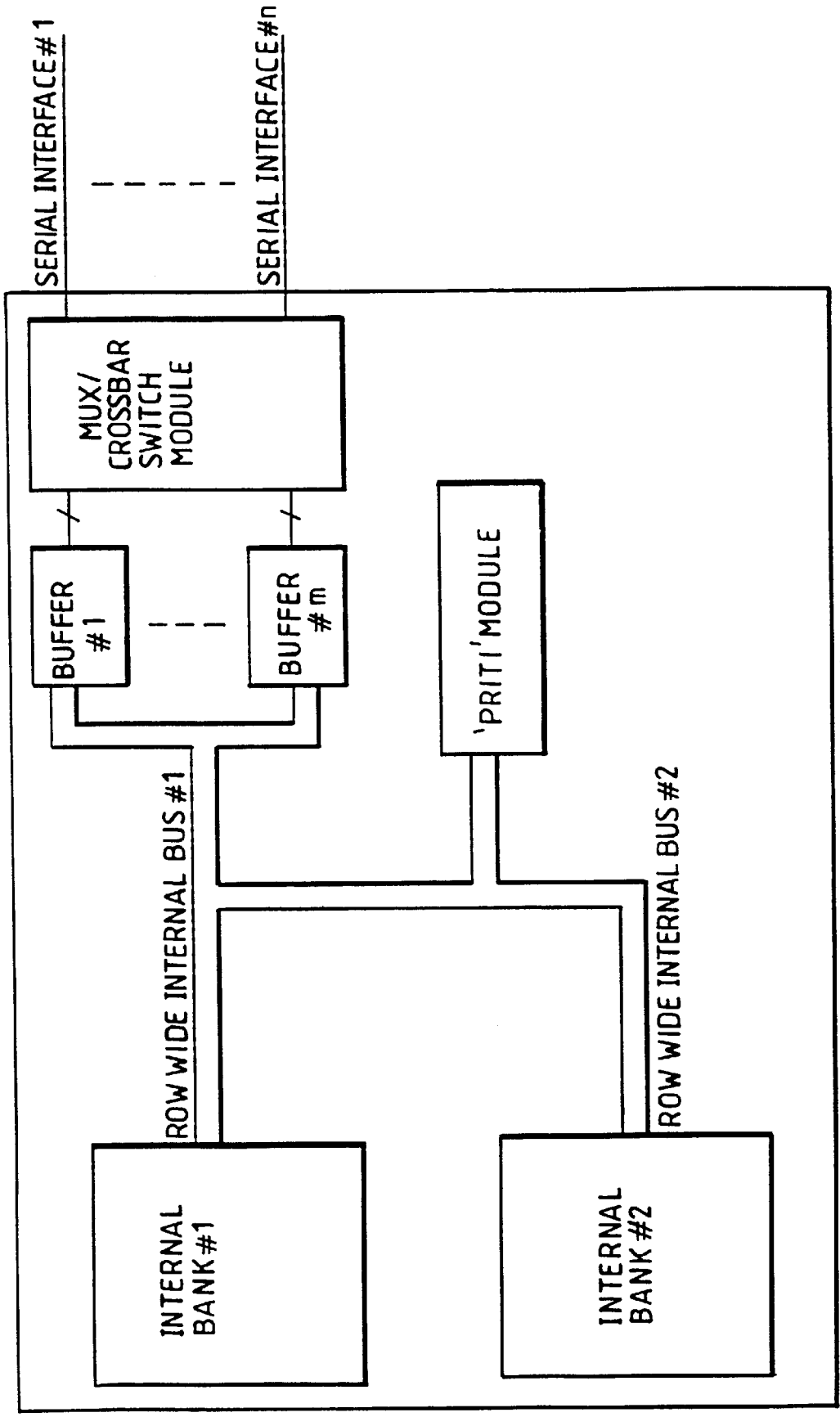
Figure 26:
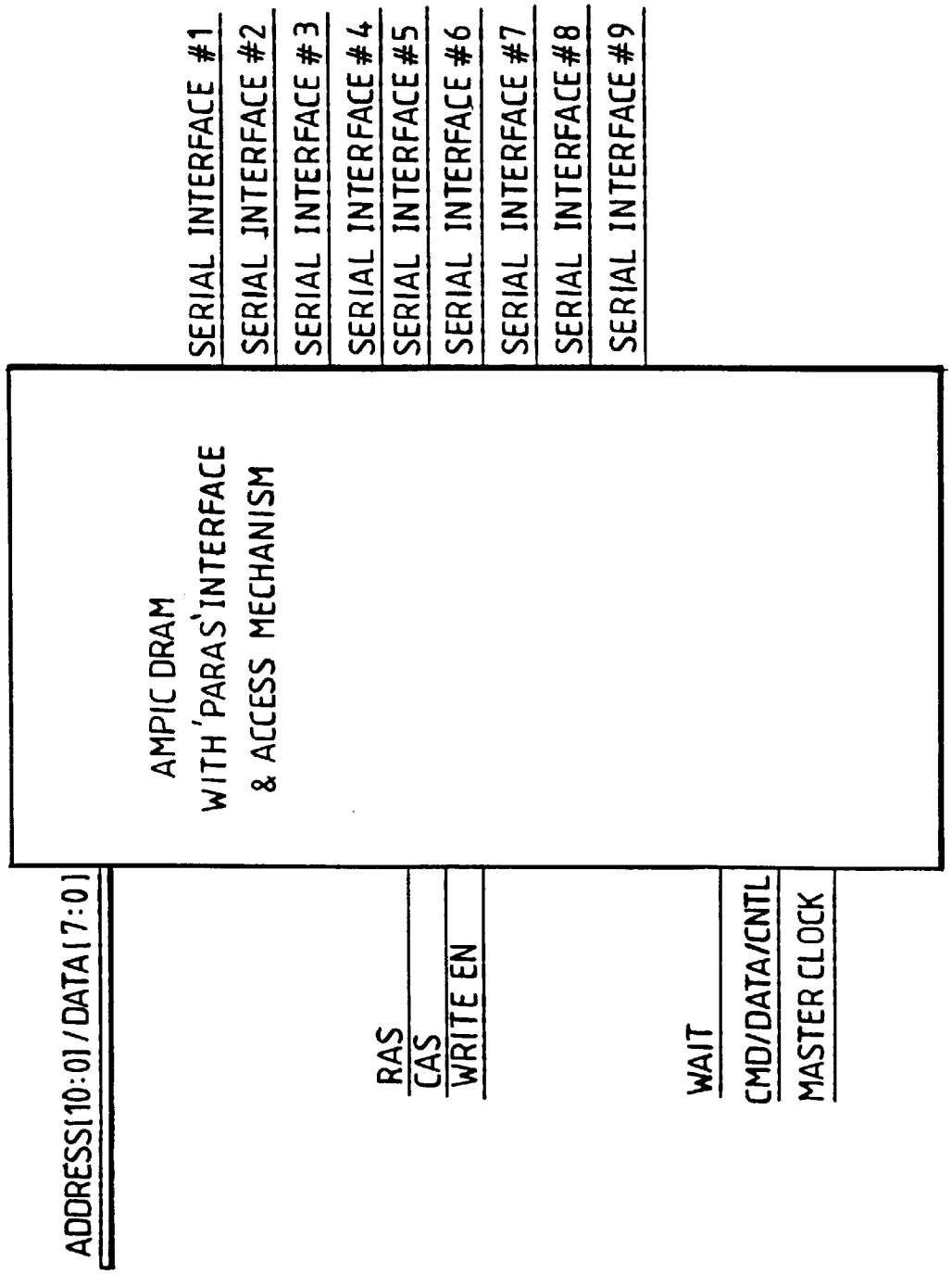

FIG. 19 presents an example of a useful pinout for an 'AMPIC DRAM' of the invention and to handle both large and small packets efficiently with an exemplary 9 serial interfaces;

FIG. 20 illustrates an exemplary networking equipment architected with AMPIC DRAMS of the invention with a 32 bit wide system bus operating with the CPU;

FIG. 21 is a similar diagram for a graphics application;

FIG. 22 is a similar diagram illustrating a four bank system configuration with each bank is connected to different network interfaces;

FIG. 23 is similar to FIG. 22 but uses two banks of 'AMPIC DRAMs' and two banks with traditional DRAMs;

FIG. 24 is also similar to FIG. 22 but with two banks for graphics and two for other applications;

FIG. 25 is a diagram of still a further modification of an 'AMPIC DRAM' architecture in which there are two internal banks and the before-mentioned 'PRITI' capability, wherein one bank is for main memory usage and the other bank for graphics or other applications;

FIG. 26 is a modification of the AMPIC DRAM system of before mentioned FIG. 19, adapted for use with a so-called 'PARAS' interface and access, described in copending U.S. patent application Ser. No. 08/320,058, filed Oct. 7, 1994 (now U.S. Pat. No. 5,590,078) and with a low pin count for the integrated memory architecture. [This application discloses a method of and apparatus for improving the accessing capability of asynchronous and synchronous dynamic random access memory devices by a novel interfacing and accessing procedure in which the same pins are used for each of row, column and data accessing and in both the write and read cycles; such enabling effective increasing of the data bandwidth and addressing range in substantially the same size packages with fewer pins.]

Figure 27:
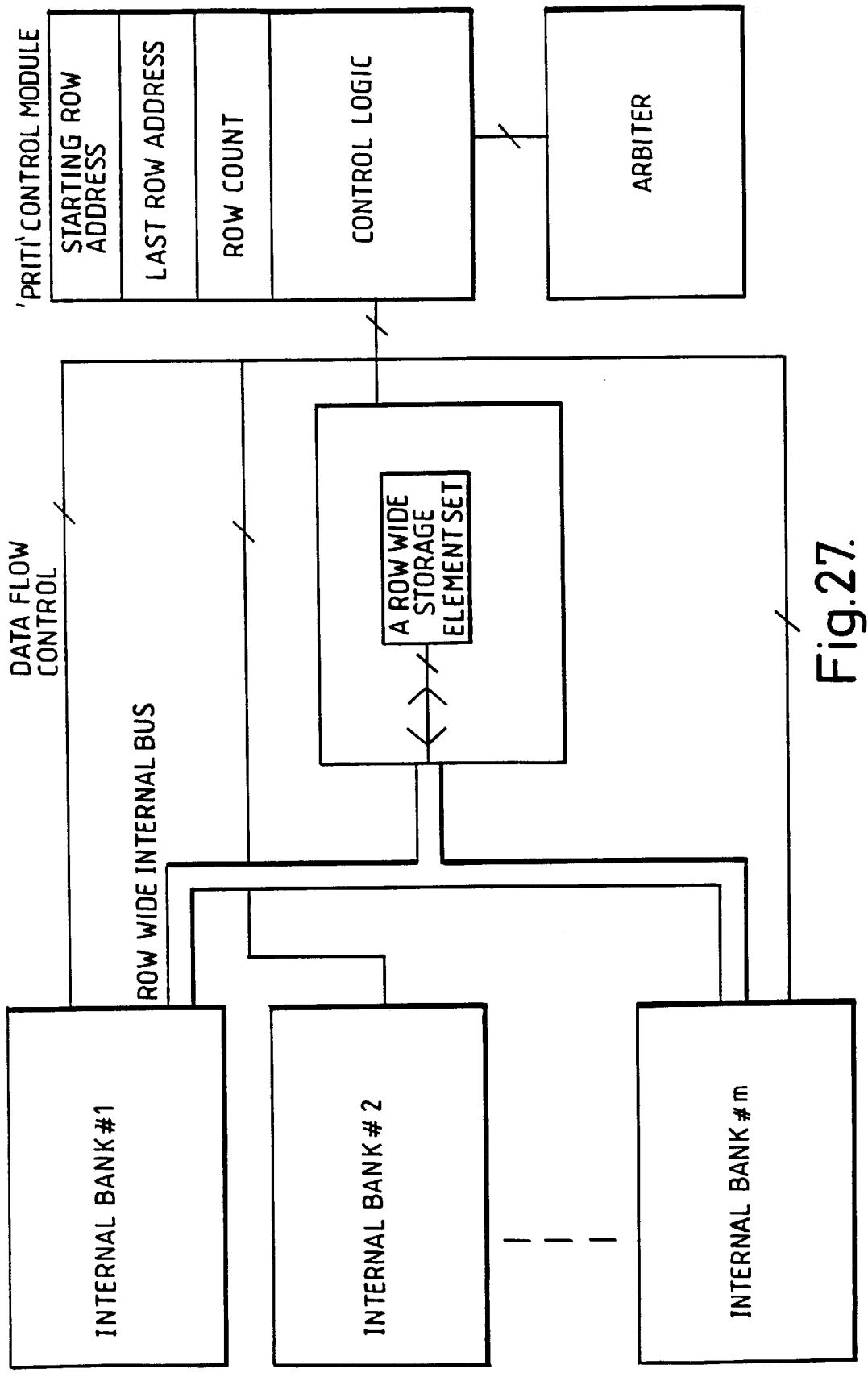

FIG. 27 is a block diagram of an example of a partial top level of a multi-bank 'AMPIC DRAM' control module architecture with the before-described parallel row internal transaction intervention (PRITI), with a one row wide set of storage elements;

PREFERRED EMBODIMENT(S) OF THE INVENTION

It is now in order to describe the invention for eliminating the bandwidth and other previously described bottlenecks in its new 'AMPIC DRAM'-centered switching solution by dramatically reducing the number of transfers and corresponding arbitrations on the system bus, thus substantially improving the over all system performance and with a much faster internal data transfer capability. Other benefits include the system expandability or scaling with much lower impact on the data bandwidth, resulting in reduced system cost as before stated.

Figure 7:
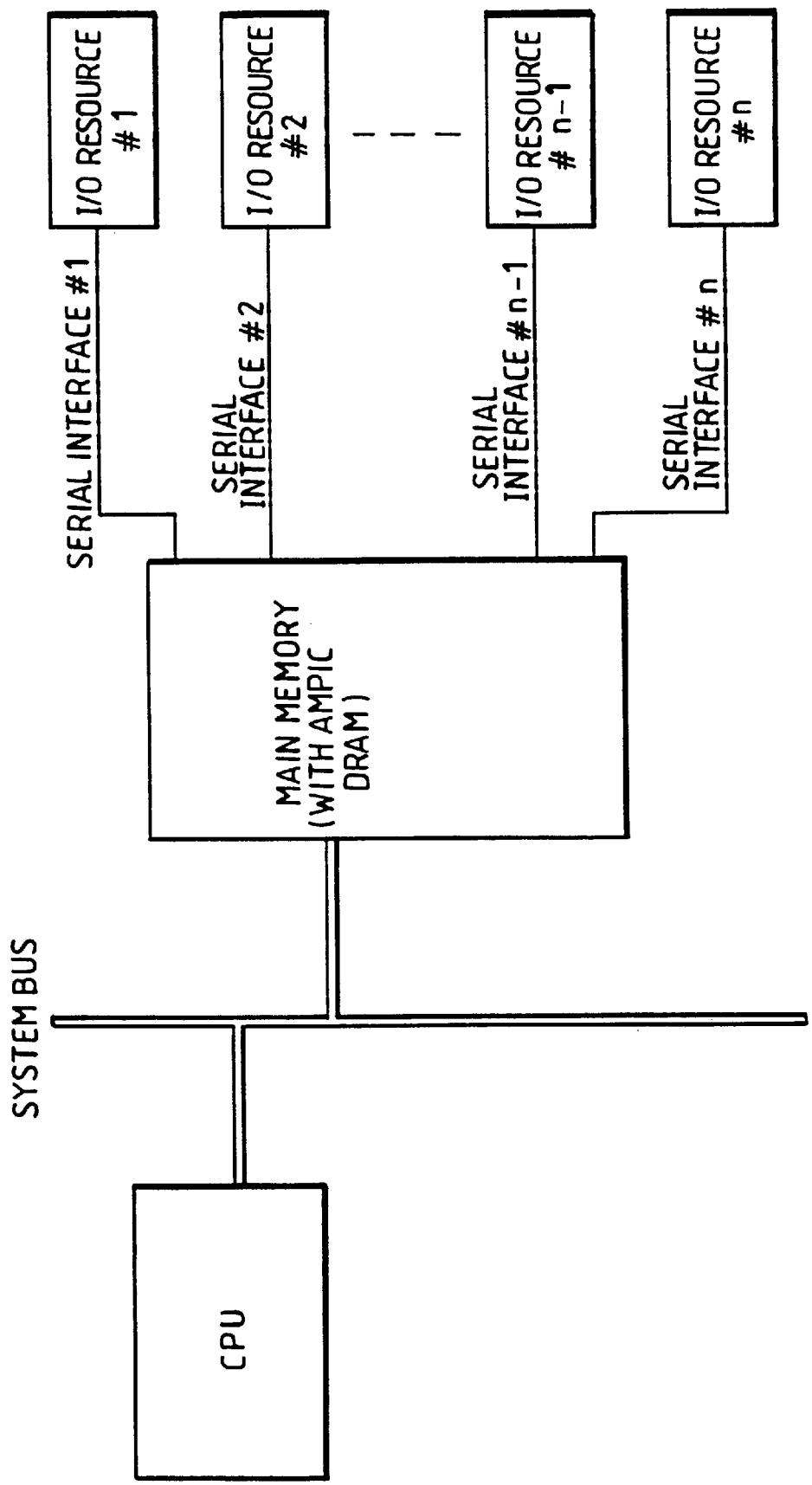
FIG. 7 is a block diagram of a system architecture constructed in accordance with the present invention and embodying a multiple-port internally cached '(AMPIC) DRAM' of the invention.

Referring to FIG. 7, a CPU unit, so labelled, using conventional primary parallel port data, is shown connected to a system bus, also connected with the main memory unit containing the later-described 'AMPIC DRAM' of the invention, and into which supplemental serial interface inputs (#1 thru #n) are connected from respective input/output(I/O) resources #1 through #n.

Figure 8:
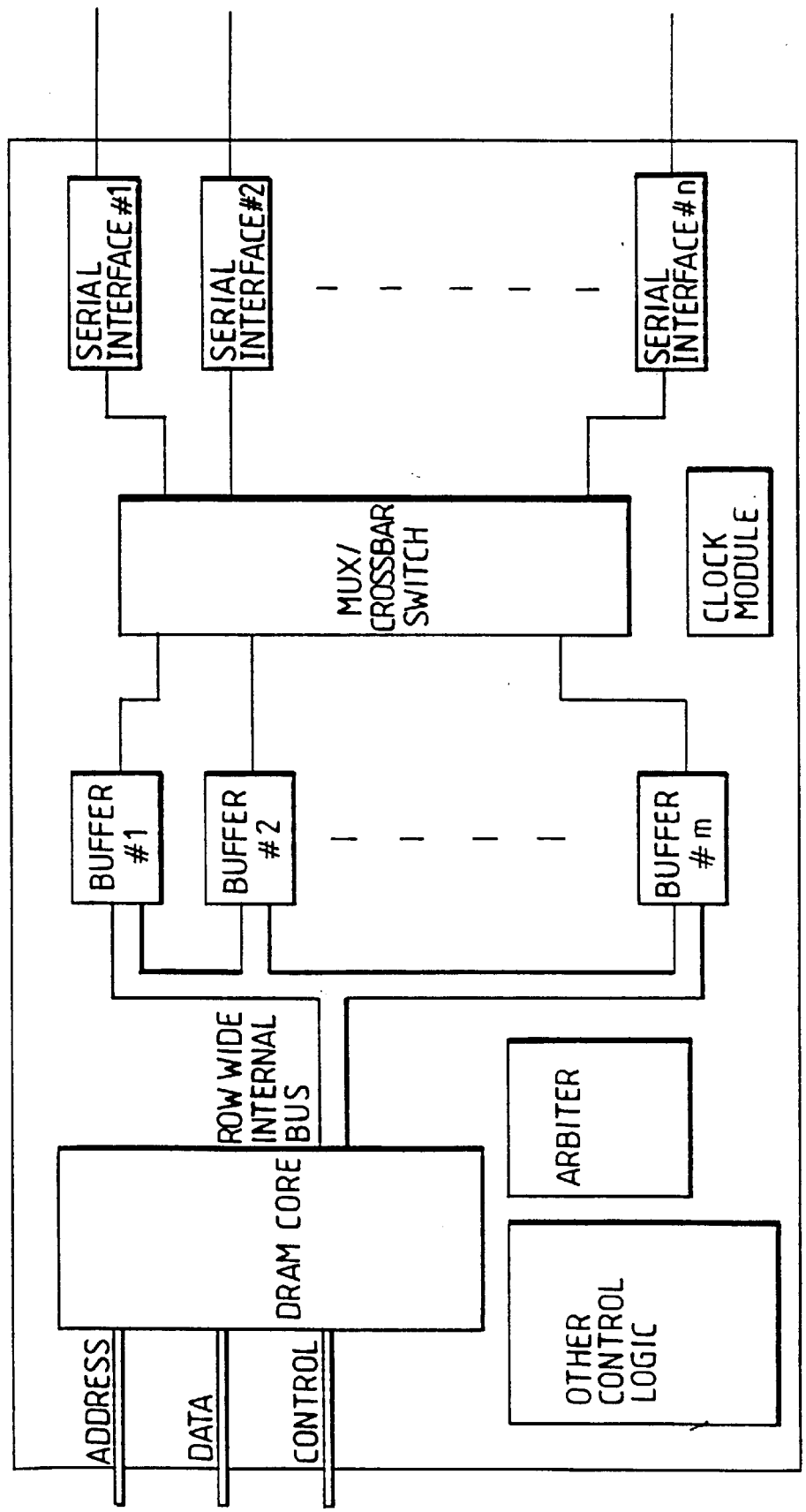
FIG. 8 is a similar view of a partial top level architecture of the 'AMPIC DRAM' of FIG. 7, showing multiplex/crossbar switching between supplemental serial interfaces, buffers and the DRAM core.

In this illustration, multiple one bit wide independent serial interfaces are thus provided on the 'AMPIC DRAM' to transport data between the I/O resources and the main memory. These serial interfaces are in addition to the primary parallel ports for the system bus interface for possible use by the central processing unit CPU or similar master controller device. The number of such serial interfaces is limited only by the device technology, pin count, power consumption and cost, etc. The serial data received or data to be transmitted via these interfaces #1 through #n, is stored inside the 'AMPIC DRAM' in small respective buffers #1 through #n, as more fully shown in FIG. 8. For practical considerations, this could range from 64 bytes to 512 bytes, but in general is limited by the layout of the sense amplifiers. In a traditional layout, it is limited to the number of data bits available in one row of the DRAM core. Thus, if 1024 bytes are available per row access, then the maximum buffer size 'AMPIC DRAM' could be designed for is 1024 bytes per internal bank. If 'm' is the number of buffers and 'n' is the number of serial interfaces, then the number of packet buffers 'm' (where the term "packet buffers" is used interchangeably with the term "buffers") is greater than or equal to the number of serial interfaces 'n'. The upper limit on 'm' is restricted by the technology limitations rather than by the architecture.

In accordance with a preferred embodiment, a multiplexer and/or crossbar switch logic or combination (mux/crossbar switch in FIG. 8) connects the 'n' serial interfaces to the 'm' buffers. The connection between each serial interface and a buffer is dynamically configured as by the CPU (or the current system bus master) and is altered as appropriate for data routability.

Figure 9:
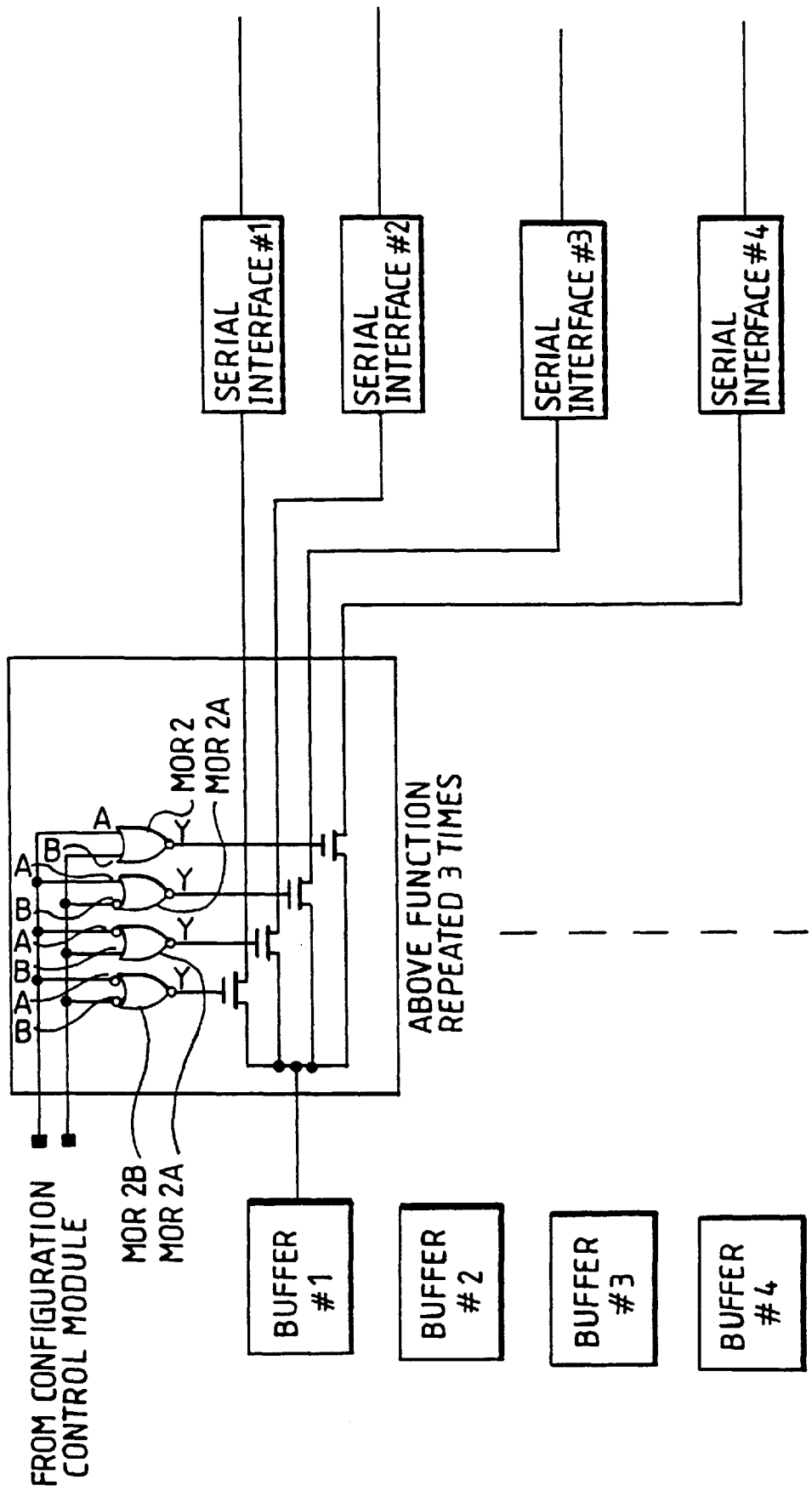
FIG. 9 illustrates details of an illustrative serial data-multiplexer implementation in FIG. 8.

A functional block diagram of one possible serial data interface implementation is shown in FIG. 9, for the configuration of 4 serial interfaces and 4 buffers. There are, however, multiple ways to implement the desired architecture, though the basic idea remains the same. When data need be moved in FIG. 8 between the packet buffers and the DRAM core, arbitration among the various active packet buffers is performed for access to the internal common bus. No arbitration, however, is required to receive or transmit data from/to the packet buffers via the serial interfaces.

The incoming packet buffer can be redefined as output packet buffer and data rerouted to its destination without even performing the intermediate step of transferring the data between the buffers and the core DRAM! This reduces the latency involved in reception of an incoming packet and its subsequent transmission to its destination. This is possible only because of the 'AMPIC DRAM' capability to assign any buffer to any serial interface via the Mux/Crossbar switch module.

Figure 10:
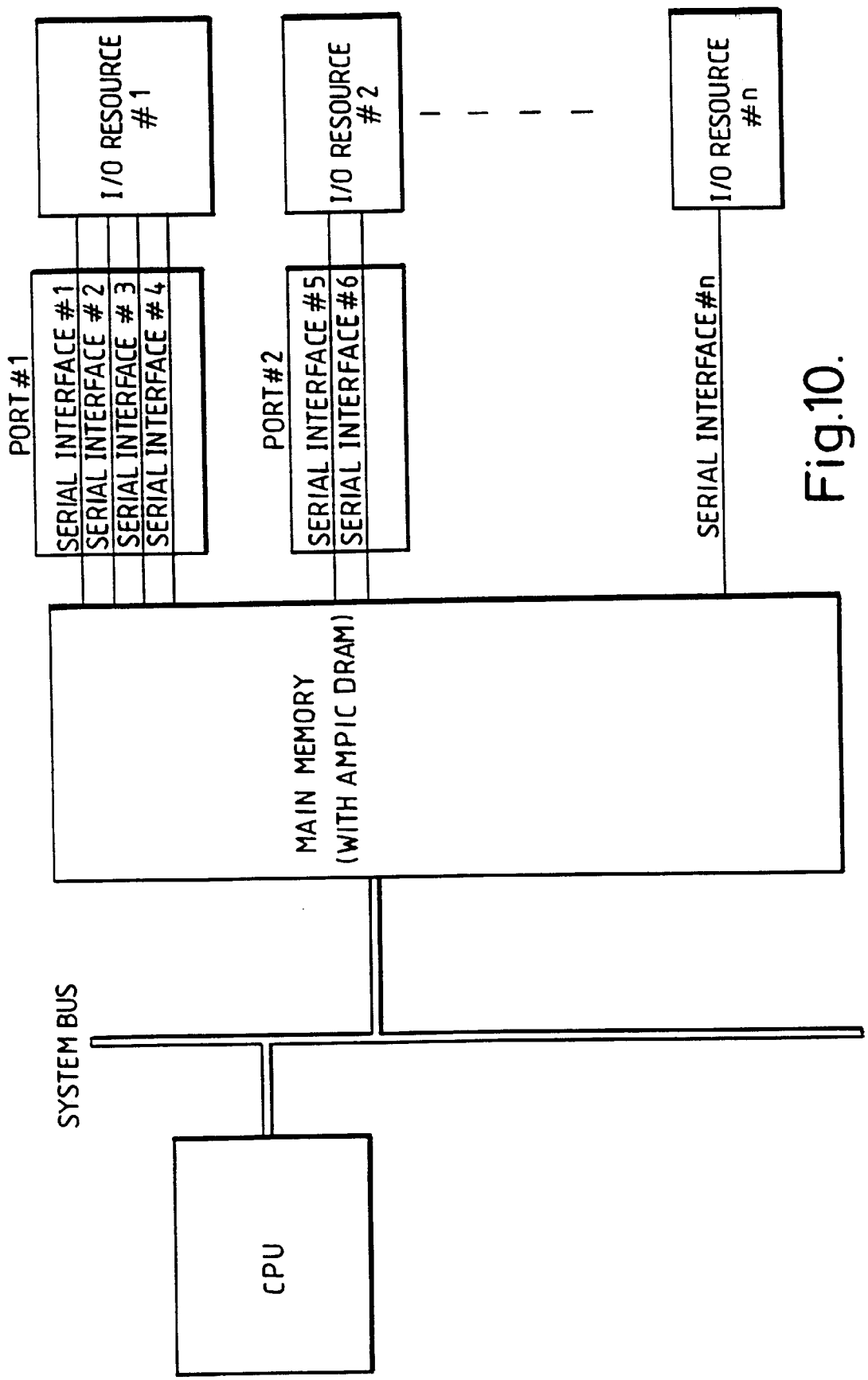
FIG. 10 shows an example of the multiple serial interfaces configured as ports.

In 'AMPIC DRAM' architectural organization, multiple one bit wide serial interfaces can also be configured as a narrow width bus (termed "port") of sizes such as 1, 2, 4 or 8, etc, but in theory there is no such limitation. It can be any number from 1 to 'n' permissible by the device technology and is also subject to implementation. Once multiple serial interfaces have been grouped and defined as a port, they all connect to a common packet buffer, as more particularly shown in FIG. 10, wherein a 1 bit wide port is the same as a serial interface. This allows even faster data transfers and maintains flexibility at the same time, and is very useful in interfacing with resources operating with different bandwidth and data transfer requirements. It also follows that each packet buffer, FIG. 8, has the capability to interface with a maximum of 'n' serial interfaces simultaneously, if defined as a port. The buffers get configured for the same port size identical to the port to which it is connected (also sometimes termed docked).

Figure 11:
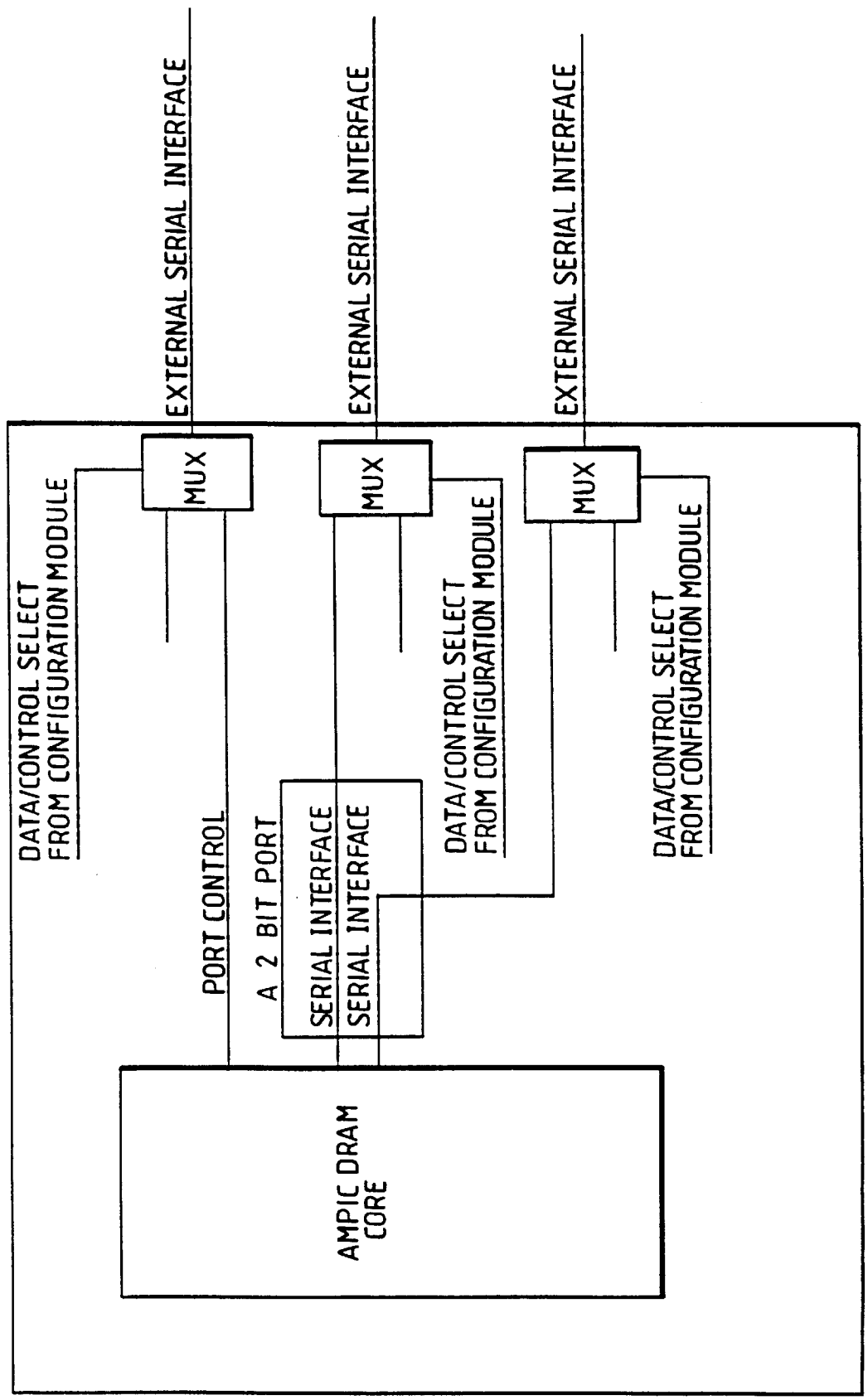
FIG. 11 is a diagram of an exemplary 2-bit port of the AMPIC DRAM and associated control line.

The serial data flow on each port is controlled by its respective control line. Each port interface consists of one control and a set of serial data interfaces. As an example, if each serial port is only 1 bit wide, then one control line is used per one bit of data line. If two serial interfaces are configured as one port, then one control line is used for the two bit port and so on, as shown in FIG. 11. To minimize the pin count, moreover, a serial interface control line is also configurable as a serial data interface line so long as the criterion of one control line per port is met. The association of each control line to its port is configurable. The purpose of the control lines is to control the data flow between the I/O resources and the serial ports. If pin count is not a concern for the manufacturer, one certainly could provide separate control pins. For some applications, furthermore, control pins are not even required, and the I/O resource parallel interface to the system bus is sufficient to exchange the control information.

Figure 12:
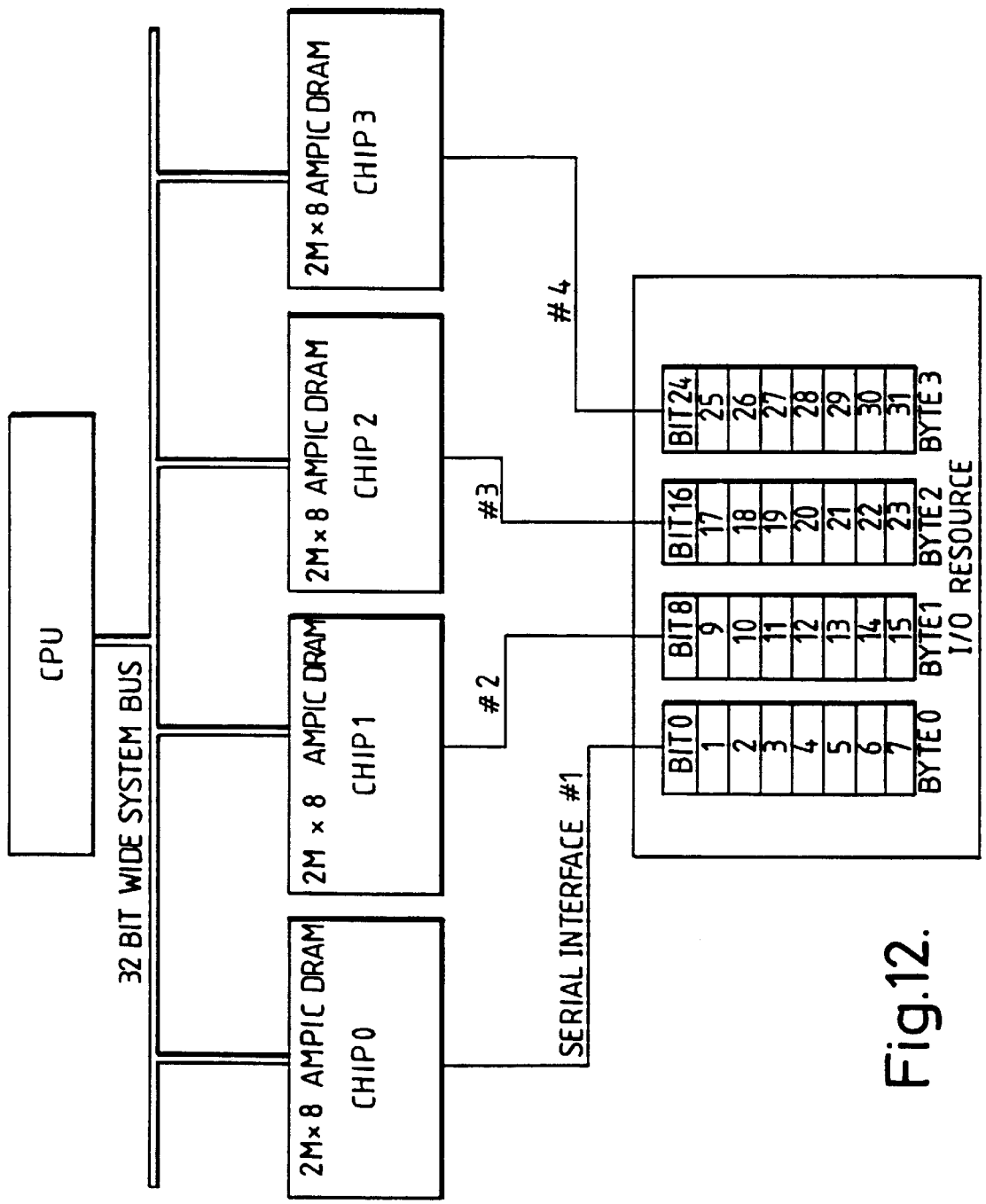
FIGS. 12 and 13 are diagrams of examples of a serial data transfer format, with FIG. 13 applied to the illustration of the 2 bits per port.

The data transfer format between an I/O resource and the 'AMPIC DRAM' serial port is such that each memory chip (part of the same external bank) receives and transmits data bits on its port simultaneously, as illustrated in FIG. 12. This can be better explained with an example. Assume the four 'AMPIC DRAM's of 2M×8 form with a 32 bit wide system interface as in FIG. 12 (with a port being defined as a one bit serial interface). Each of the four chips receives data simultaneously. The chip0 receives bit0, chip1 receives bit8, chip2 receives bit16; and chip3 receives bit24. In the next cycle, all the bit numbers will be incremented by 1. This will continue until all 32 bits have been transferred, so that each chip received its 8 bits. Once completed, this process will be repeated for, as illustrated, in FIG. 12, the next 32 bits, and so on. in this arrangement of FIG. 12, moreover, the number of AMPIC DRAM chips, each with its internal bus, FIG. 8, has been increased to four, with a corresponding four-time increase in effective available internal bus capacity (bandwidth). Simultaneously, with the increase in the number of AMPIC DRAM chips, there has been an increase in the amount of data handled by the chips. This results in a corresponding increase in the internal data switching capacity of the system.

Figure 13:
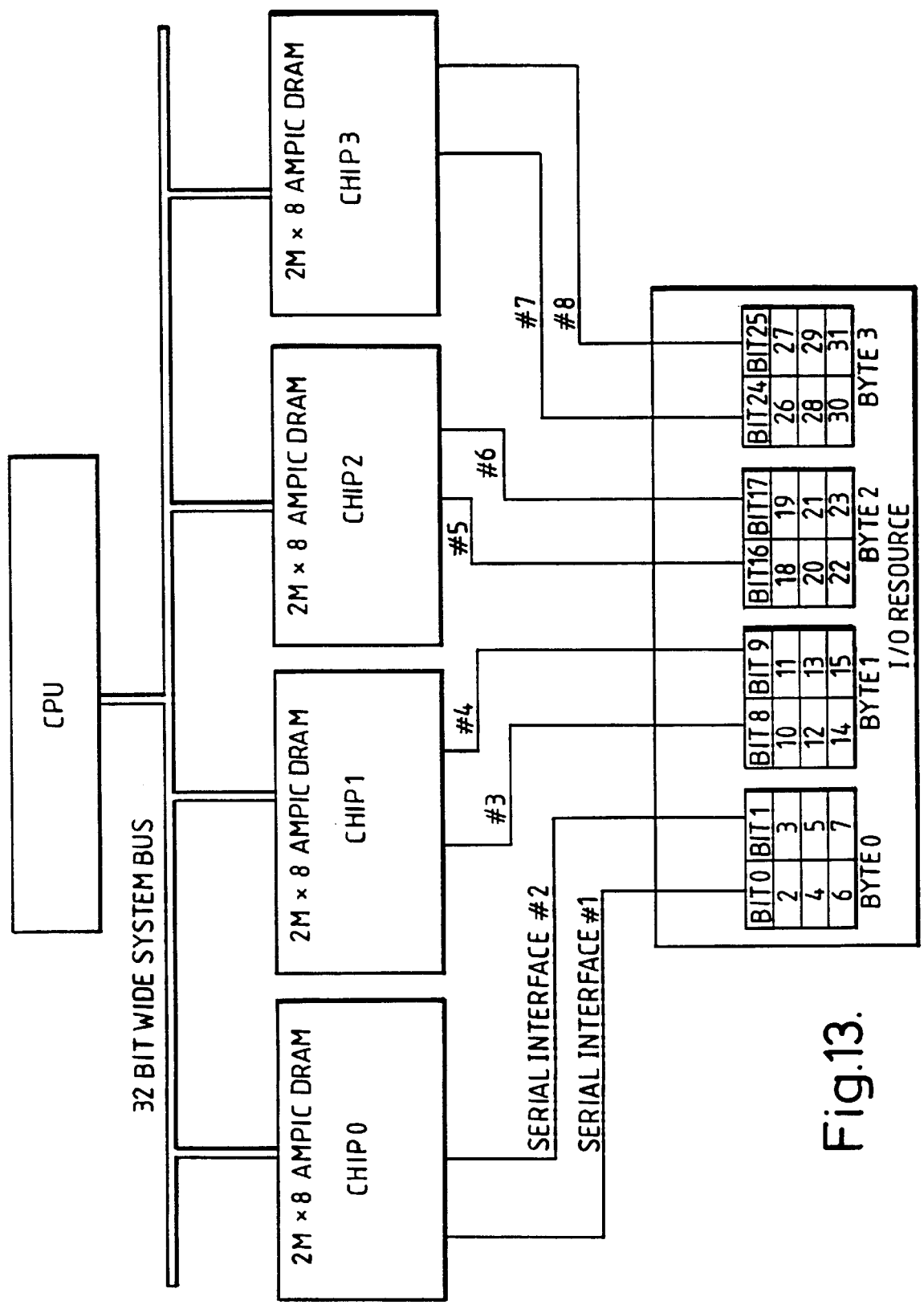

Consider, now, another example when a port is expanded to consist of two serial interfaces, as in FIG. 13. A total 8 bit interface is then provided to the I/O resource, which must provide two bits each, to each 'AMPIC DRAM' simultaneously. The ordering of the bits is such. By so increasing (or more generally, varying) the number of I/O resources per AMPIC DRAM chip, the amount of data presented to the chip for switching via its internal system bus increases (varies) correspondingly. that chip0 receives bit0 and bit1, chip1 receives bit8 and bit9, chip2 receives bit16 and bit17; and chip3 receives bit24 and bit25 concurrently. In the next cycle, all the bit numbers will be incremented by 2. This will continue until all 32 bits have been transferred, so that each chip received its 8 bits. Once completed, this process will be repeated for the next 32 bits, and so on.

It should be noted that this architecture of the invention does not prevent the I/O resources, such as network controller chips, from sharing the parallel system bus, if so desired. It could be useful for tasks such as controller configuration and status management.

Preferably, the 'AMPIC DRAM' is provided with one master clock pin as shown in FIG. 19, and every serial interface is configured to operate at a multiple or submultiple of this clock rate, allowing, flexibility to accommodate a variety of resources. It is also possible to provide more than one independent clock instead of one master clock, the limitation being only the device technology, pin count, and cost constraints. It should be noted that the clock frequency assignment is a characteristic of the serial interface and not of the buffers. Thus, any of the 'm' buffers can be docked to any of the serial ports and operate at that port speed.

The 'AMPIC DRAM' configurability of the invention, in addition, allows switching the serial interface from one buffer to another buffer without interrupting the transfers. This has a number of important applications in networking and graphics. One buffer can be loaded with row wide data in one access, while the other one is being used to transmit the information. It should be noted, furthermore, that while a similar two buffer approach has been implemented in VRAMs by other vendors, called split buffer transfers, this is quite different from the present invention in that the external I/O interface with the buffer is always fixed and of the same width as the VRAM system data width. The 'AMPIC' 's multiplexer/crossbar switch module of this invention, totally eliminates all such limitations.

There can be more than one internal bank in the AMPIC DRAM connected via a row wide bus such that all the buffers reside on this bus; or in another embodiment, separate groups of buffers may be provided for each internal bank.

Figure 14:
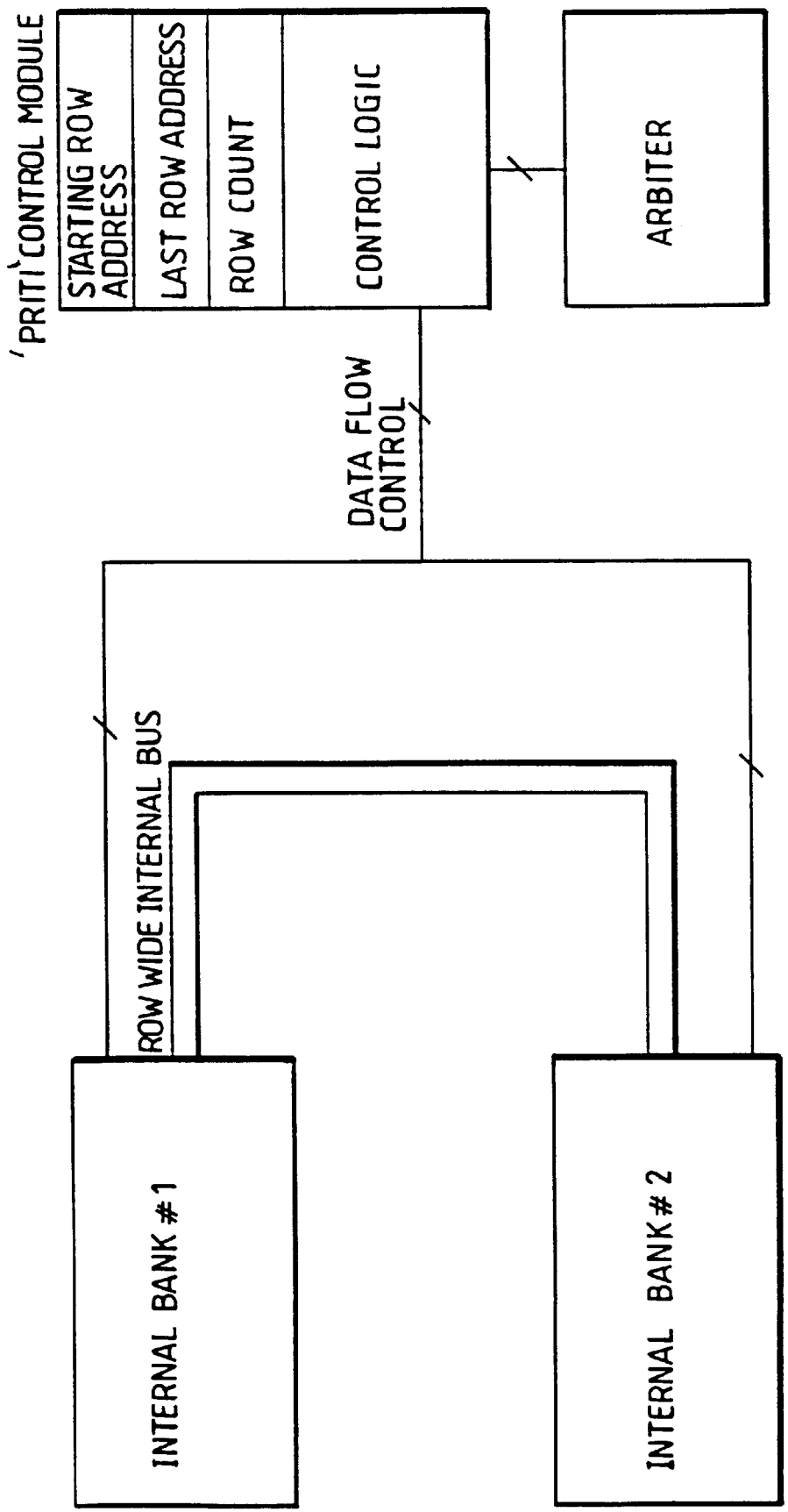
FIG. 14 is a block diagram of an example of a partial top level of a two-bank 'AMPIC DRAM' control module architecture with a later-described parallel row internal transaction intervention (called PRITI), without storage elements.

The impact on the system bandwidth due to the frequent 'BitBlt' operations above-described can be reduced considerably by having more than one internal DRAM core bank, as in FIG. 14, connected via a row wide interface such that when a transfer need be made from one internal bank of the memory to the other internal bank, the appropriate row address of each bank is strobed with corresponding 'RAS' signals simultaneously. After the data from the row being read is available at the sense amplifiers, it is written to the other bank. The direction control is provided by the internal logic, with FIG. 15 showing the sequencing of such an operation. After a row transfer is completed, another transfer can be initiated, and this process can go on until it is complete. This type of transfer is named 'PRITI' (Parallel Row Internal Transaction Intervention). Obviously when such an internal transfer is going on, other accesses to the accessed banks are not permitted. It should be noted that the transfer on the serial interfaces can also go on in parallel to this internal transfer. A similar concept, later contrasted from the features of the present invention, is disclosed in U.S. Pat. No. 5,473,566, issued on Dec. 5, 1995.

Through this novel technique, in one row access time, a massive amount of data can be transferred. As an example, consider an 'AMPIC DRAM' with two internal banks, each being 1M×8. The internal structure for each bank is 1K rows, each being 8 bit wide. With 'PRITI' capability, in one 'RAS' cycle, 8K bits can be transferred internally. This is a great advance over current-day existing approaches, where 8 bits of data are transferred via the system bus interface and in the best case will take 1K cycles and corresponding arbitrations. If there are 'r' rows and 'c' columns, then the total number of transfers required with the 'PRITI' capability of the invention is 'r'; whereas total transfers required in the traditional approach are 'r×c'.

The process is identical for any number of banks. If there are 'm' internal banks connected via a row wide interface, the 'PRITI' module is capable of transferring data from a bank to more than one remaining bank, simultaneously. This is very useful when a broadcast packet is moved from one bank to all other internal banks. With this invention, no row wide registers or latches (also termed a row wide set of storage elements) are required to perform this operation, thus resulting in a very cost effective implementation.

The top level internal structure of the 'PRITI' module is shown in before-described FIG. 14. 'PRITI' is loaded with the starting row addresses of each bank and the transfer count. After configured, it arbitrates to acquire the internal buses of both the banks. There can be many variations on this basic concept, such as the 'PRITI' module being configured for a predetermined number of burst transfers once it acquires the right to access the rows, or release the bus after every transfer to allow other resources to share the DRAM core.

Figure 18:
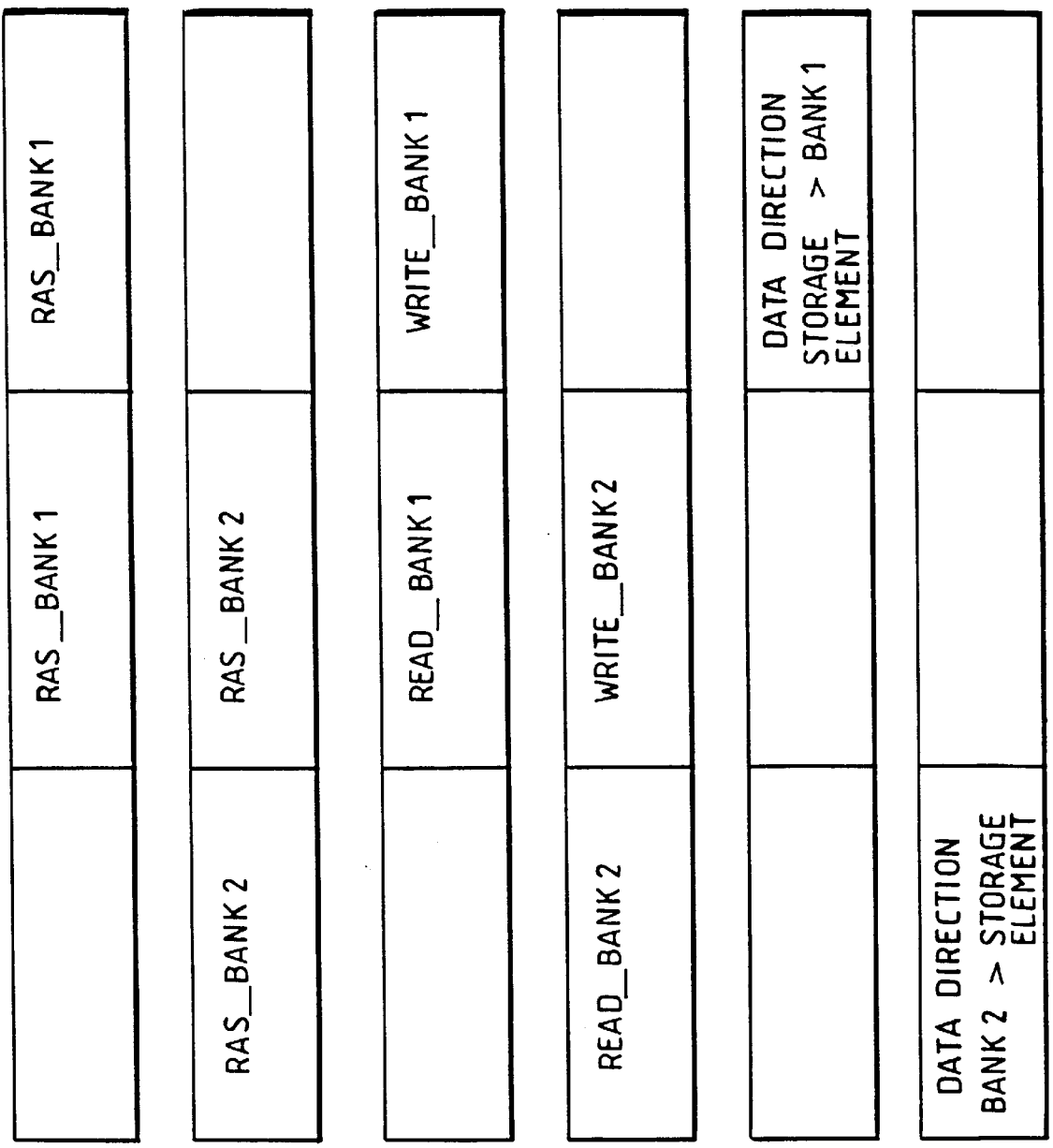
FIG. 18 is similar to FIG. 17, but employs only one row wide set of storage elements.

An alternate embodiment of this invention involves using a row wide set of storage elements as labelled in FIG. 27 (or any implementation capable of performing a logically equivalent task) to perform a data exchange operation. As an example, for a 1M×1 DRAM having 1024 bit wide row, the said set of storage elements would contain 1024 storage elements. Here, a row of an internal bank is accessed with read operation, and the retrieved data at the sense amplifiers for the bank (call it bank2) is stored in the row wide set of storage elements. Data is then retrieved from the other bank (bank1) and is then written to bank2. Subsequent to this operation, data from the storage elements is written to the bank1. The diagram of FIG. 18 shows a suitable sequencing of such an operation. This implementation requires less circuit than the later-described approach with two sets of storage elements and still permits data exchange, though at the cost of somewhat slower execution. This approach is a universal approach for banks 1 to 'm'. This capability permits a massive information exchange in a very short time, an exceptionally useful tool for multimedia/graphics applications. This implementation obviously requires more circuit than the original approach due to the addition of a set of storage elements, but here it is not necessary to save the original data before new data is moved at its place.

Figure 16:
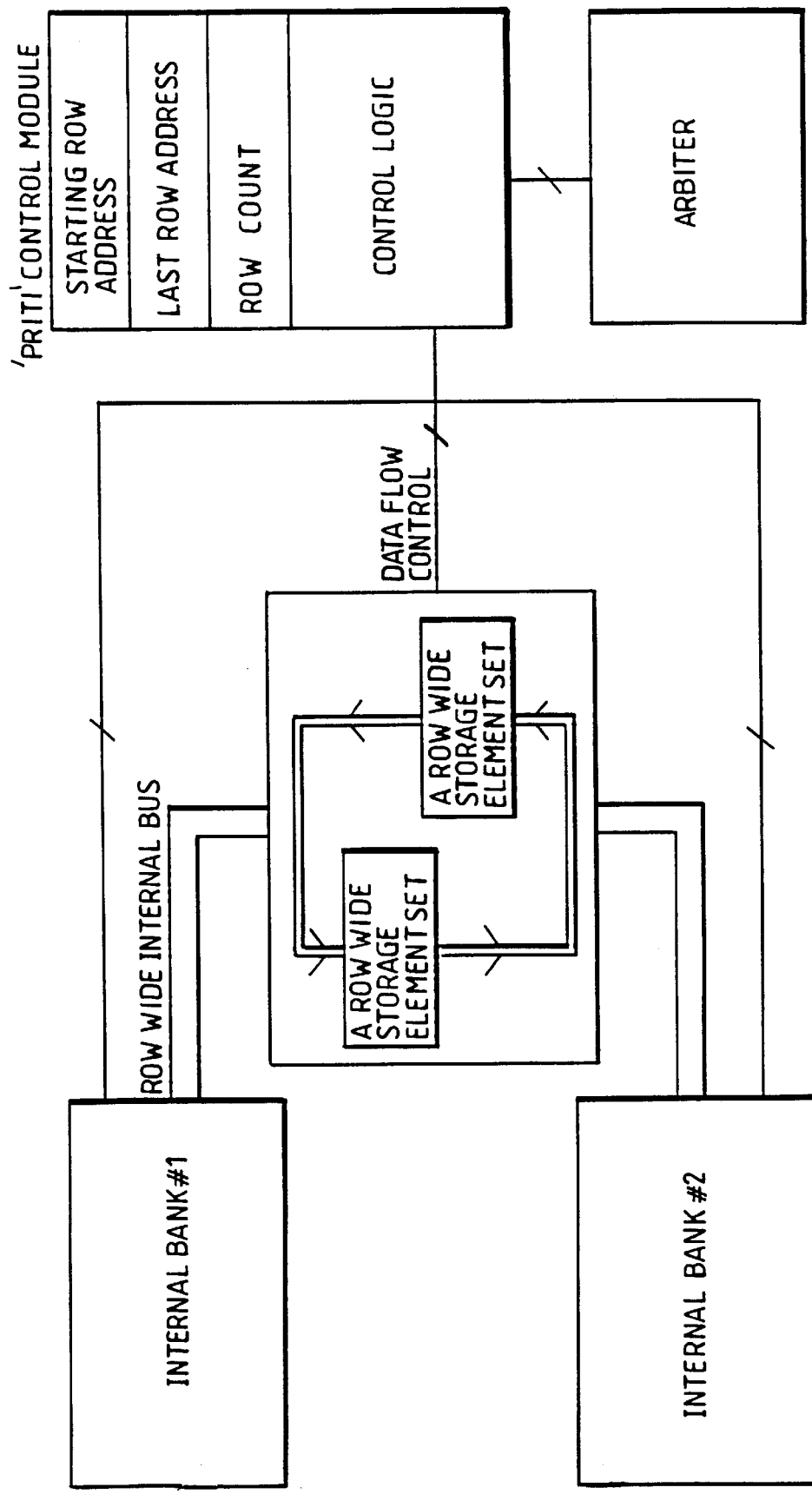
FIG. 16 is similar to FIG. 14 but with two row wide sets of storage elements provided for the 'PRITI' capability.
Figure 17:
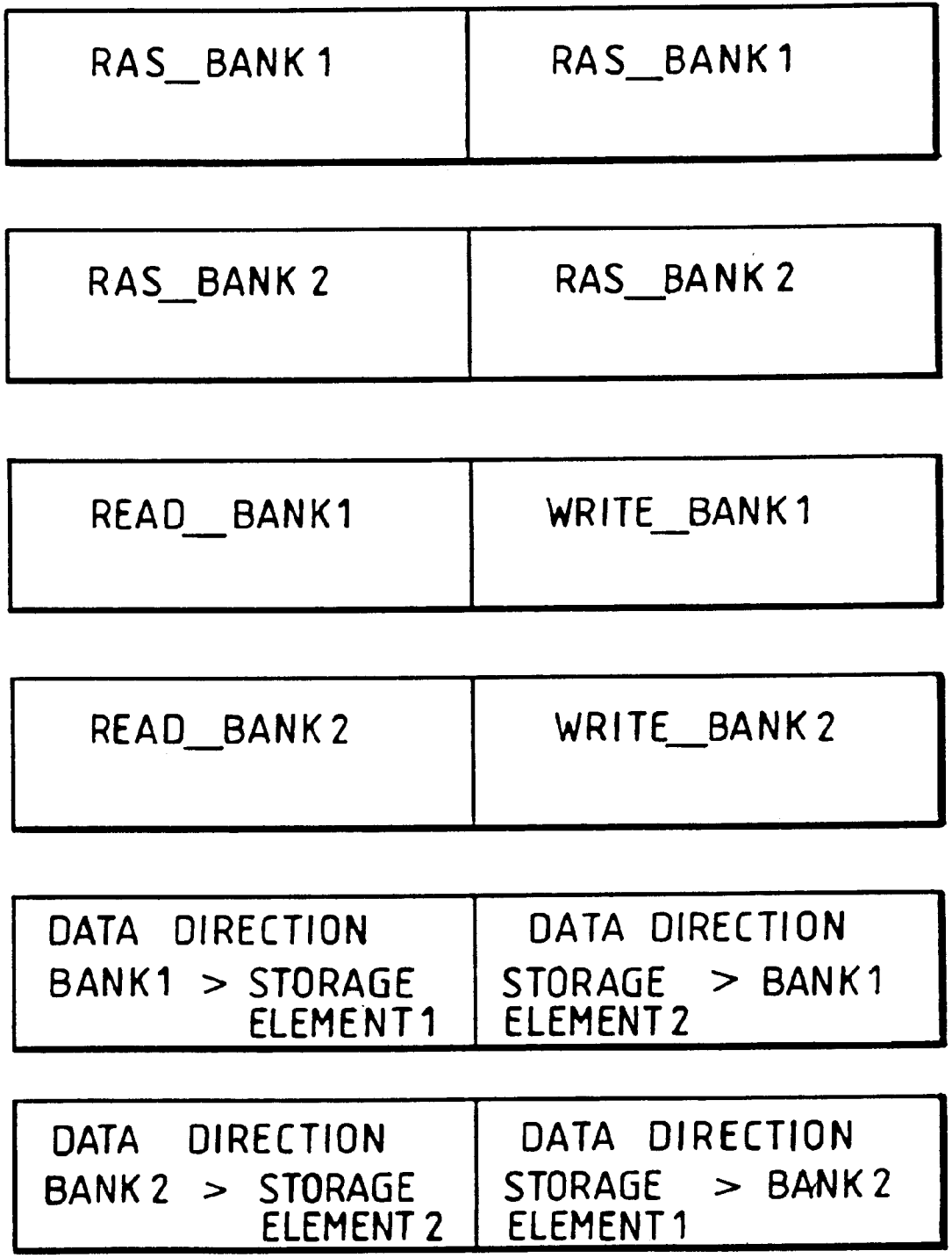
FIG. 17 illustrates the 'PRITI' transfer, with two row wide sets of storage elements of FIG. 16, showing the sequence of operations and internal data exchange between the two banks.

Another modification of this invention uses two sets of storage elements as labelled in FIG. 16 (or any circuit capable of performing a logically equivalent task) to perform a data exchange operation. Here, a row in each of two internal banks is accessed simultaneously with read operation, and the retrieved data at the sense amplifiers is stored in the row wide set of storage elements, as indicated in FIG. 16. Data so retrieved and then stored is subsequently written back to both the rows simultaneously. The diagram of FIG. 17 shows exemplary sequencing of such an operation.

The 'PRITI' approach of the invention, therefore, is not restricted to two internal banks only, and is equally applicable for any multibank organization inside a DRAM chip. It is also possible to add 'PRITI' capability even in a traditional type DRAM without the rest of the 'AMPIC DRAM' architecture. A more sophisticated 'PRITI', furthermore can also have the transfer boundaries defined in terms of columns in addition to rows requiring additional registers to load the column addresses.

Unlike the system of said U.S. Pat. No. 5,473,566, in accordance with the preferred embodiment of the invention, only one row wide set of storage elements is required, and not one for each internal bank. This is what renders the approach of this invention suitable for universal application and keeps the DRAM construction relatively inexpensive.

Further modifications to this invention:

a. more than one row wide bus is implemented along with their own set of storage elements connecting multiple banks, thus allowing more than one parallel 'PRITI' transfers. In general, if there are 'm' banks, then the maximum number of possible row wide buses without redundancy is 'm/2'. If a set of such above-described storage elements is used per bus, it follows that only 'm/2' sets of storage elements are required to make 'm' separate simultaneous 'PRITI' transfers, one for each bank;

b. If the number of banks is large, then the banks can be subgrouped on separate buses. As an example, in an 8 bank configuration, 4 banks can reside on one bus while the other four are on the second bus with their own above-described 'PRITI' transfer implementation, and these two sub groups are then connected via another bus with any of the above-described 'PRITI' transfer capabilities.

While a row wide bus is used in this description, a fraction of the row wide bus is also valid, if required to reduce the cost. It should be noted, moreever, that the memory does not have to be a DRAM to take advantage of these particular capabilities.

The 'AMPIC DRAM' Impact on Interface Design

The chip has somewhat different pin out to reflect its unique architecture. One possible pinout for a 2M×8 chip with 9 serial interfaces is shown exemplarily in FIG. 19, with the added pins requiring changes in the interface design of the 'AMPIC DRAM'-based main memory.

A 'WAIT' signal is provided for the system bus interface, FIG. 19, whenever an internal transfer between the buffers and the DRAM core is taking place. The CPU (or other master controller) can either use it to delay the start of access or in an alternate implementation, the access cycle can be extended to allow for the internal transfer to complete, before proceeding with this access. A master clock pin ("master clock"), as explained earlier, is also provided.

As the 'AMPIC DRAM' is highly configurable, a mechanism is required to differentiate between a regular DRAM core access versus either a configuration command or buffer transfer interaction. The approach in FIG. 19 is to provide an additional control signal to signify a command or data access.

During command cycle, the command instruction can be carried over the data lines as they are not used during 'RAS' cycle. This is specially useful for internal transfer commands, where a DRAM core address need be provided along with the buffer ID. This scheme allows use of traditional signals 'RAS' and 'CAS' to provide the core DRAM address, where the data lines will have the buffer number or any other additional information/instruction. In fact it is possible to issue two commands: one, when 'RAS' goes active, and then when 'CAS' is asserted. There are multiple known ways to implement this access mechanism, such also being a function of the device technology and cost considerations.

While the 'AMPIC DRAM' of the invention has more pins than the traditional DRAMs due to serial ports, if the earlier proposed 'PARAS' type DRAM model of said pending application is used, one could have this DRAM with only a marginal increase in number of pins.

Networking Application Example with 'AMPIC DRAM'

As before explained, in accordance with the invention, serial interfaces/ports are provided between each network controller and the main memory. The data movement between the controllers and the main memory is primarily serial. The serial data received from a network controller, or data to be transmitted to a network controller, is stored in a packet buffer. This discussion, of course, assumes that the network controllers are capable of sourcing or receiving serial data streams in the format required by the new system architecture.

Considering the same earlier example of a 32 bit wide bus, four 2M×8 AMPIC DRAMs instead of traditional DRAMs, row wide packet buffer and four network interfaces, a user on, for example, the Ethernet network is sending a packet of 1024 bytes to another user on, for example, the FDDI network. In this novel system architecture with 'AMPIC DRAM' based main memory, as shown in FIG. 20, the data is to be received by the serial port on the 'AMPIC' connected to the Ethernet controller. No arbitration is required and no main memory bandwidth is consumed in the transfers. After the data transfer has been completed (each of the four 'AMPIC DRAMs' would receive 256 bytes), it can be transferred entirely to the DRAM core in only one access after this packet buffer acquires the internal bus via arbitration. When a row address is provided to the DRAM core, its sense amplifiers have all the data bits of this row available. Thus, the entire packet buffer can be stored in one access, if the size of the packet buffer is less than one row wide, then multiple, though still few, accesses are required.

This is a most significant advantage over the current-day existing parallel bus solutions before-described, where 256 accesses and corresponding arbitrations were required.

After this packet is transferred to the 'AMPIC DRAM' core, it is processed and retrieved it at the FDDI port in this example. Now the reverse process takes place. The packet is transferred from the core to the appropriate packet buffer in a single access requiring arbitration. This data is subsequently transferred from the packet buffer to the FDDI controller via the serial ports and then concurrently moved from the FDDI controller chip to its network. Once again, this reverse process would arbitrate only once for its transfer, whereas 256 transfers and corresponding arbitrations are required in existing designs.

Additional advantages available with this new DRAM of the invention also reside in the considerable gain achievable by the fact that a broadcast multicast packet can be loaded in all the available appropriate buffers in one access only, and subsequently transferred to the whole network, and that multiple rows can be accessed sequentially and loaded into different buffers and subsequently transferred via their ports, providing significantly higher performance.

Graphics/Multimedia Application Example with 'AMPIC DRAM'

As before stated, a significant bandwidth of any graphics system is spent in 'BitBit' operation, where a large chunk of data from one area of the memory needs to be moved to another. This consumes a considerable portion of the system bandwidth and because of it, in general, DRAMs used for graphics purposes are kept separate from the main system memory. This necessity, however, adversely impacts the system cost. The present invention also provides an approach to eliminate the necessity of two separate buses, as presented later.

Figure 1:
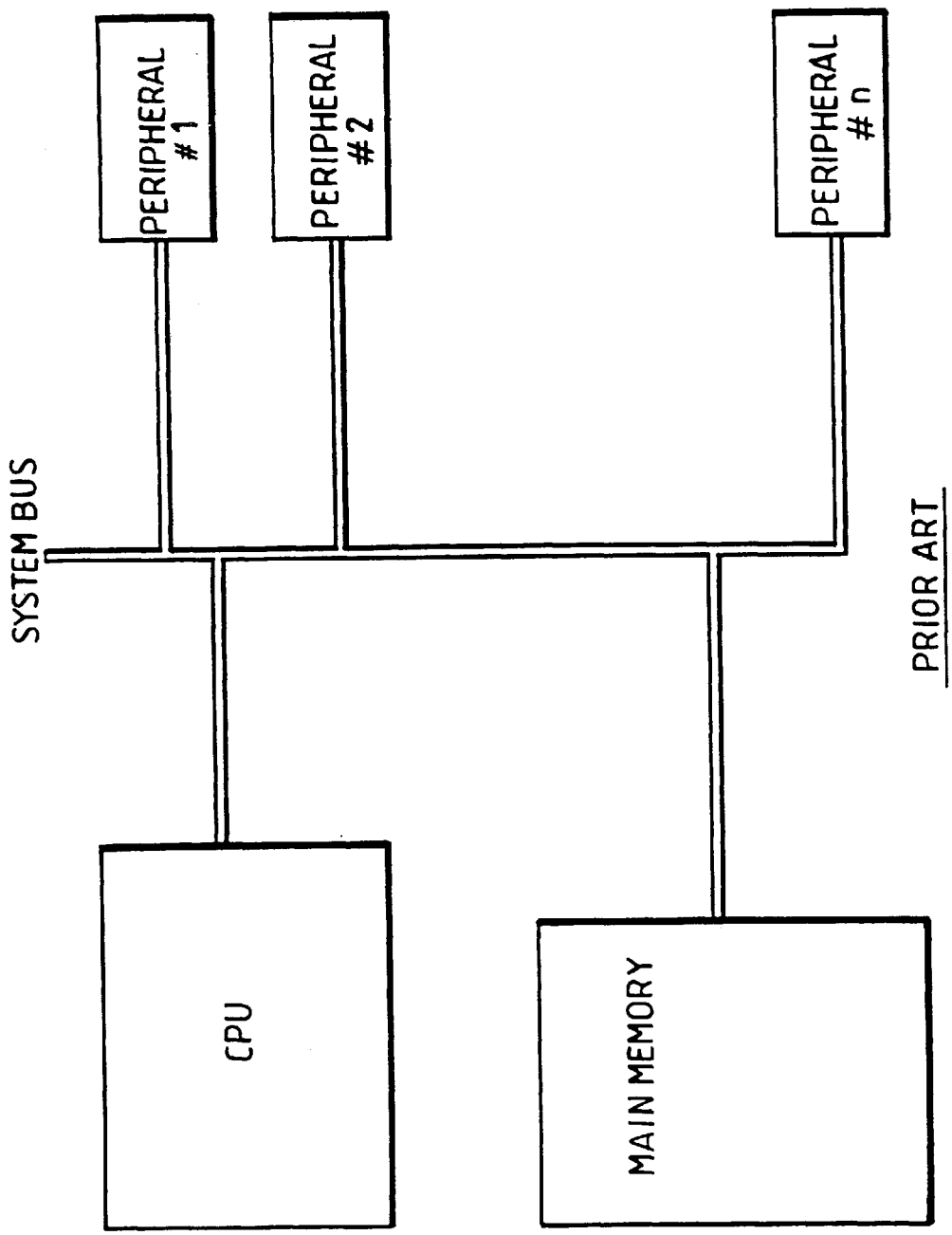
FIG. 1 is a block diagram of a typical prior art single bus parallel architecture.
Figure 2:
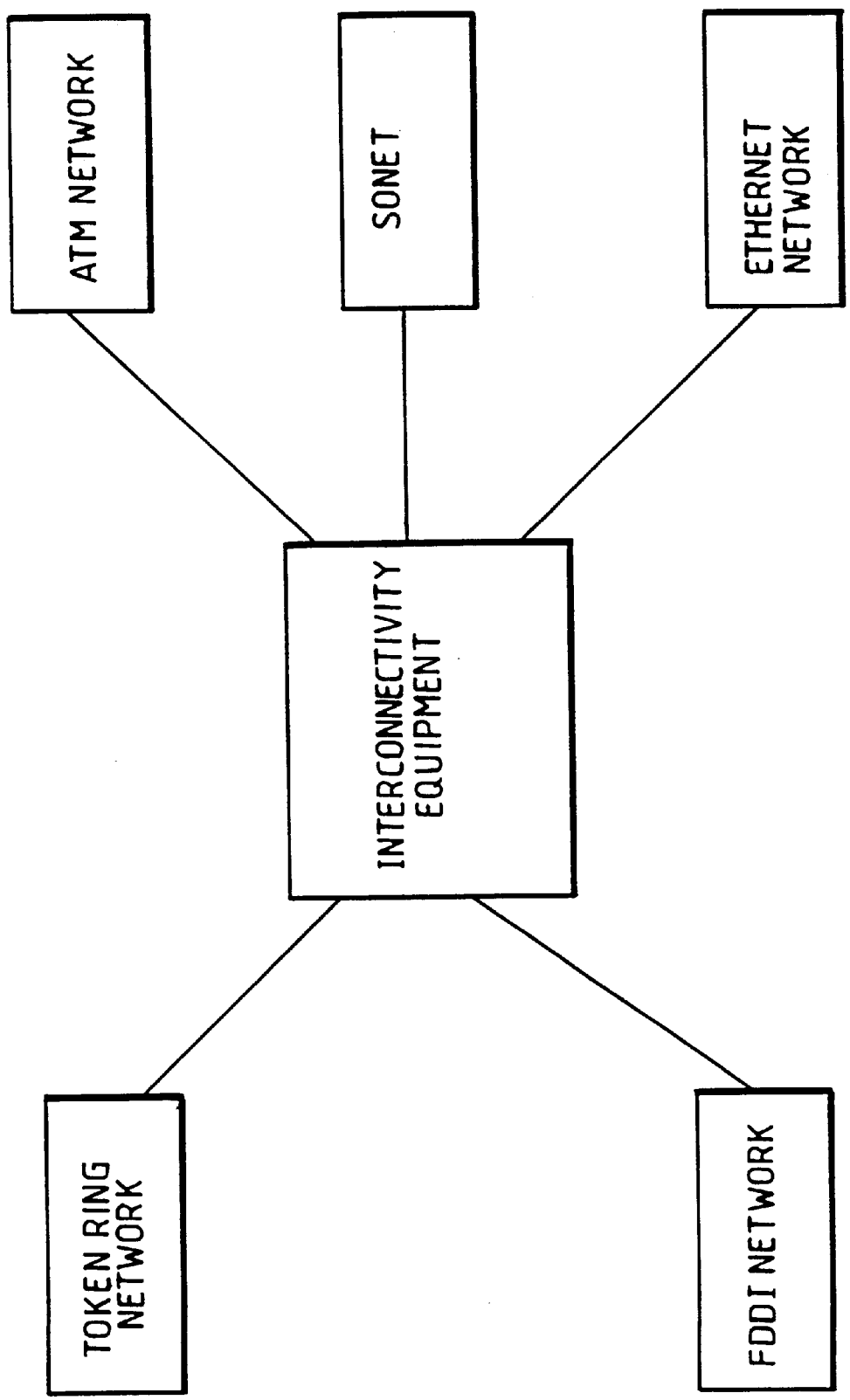
FIG. 2 shows a typical prior art network configuration
Figure 3:
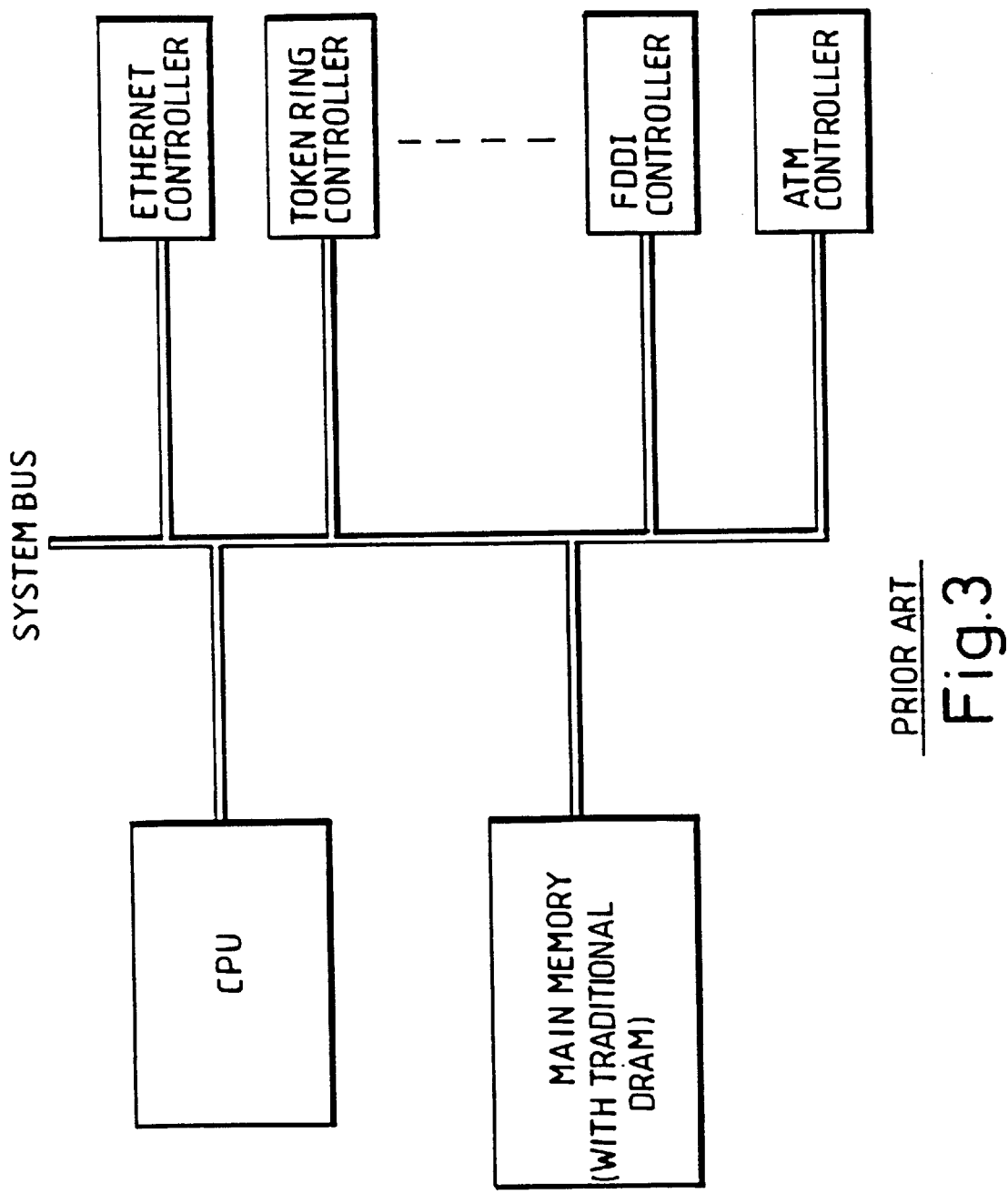
FIGS. 3 and 4 illustrate a typical prior art networking equipment employing DRAMs for use in a configuration such as that of FIG. 2.
Figure 4:
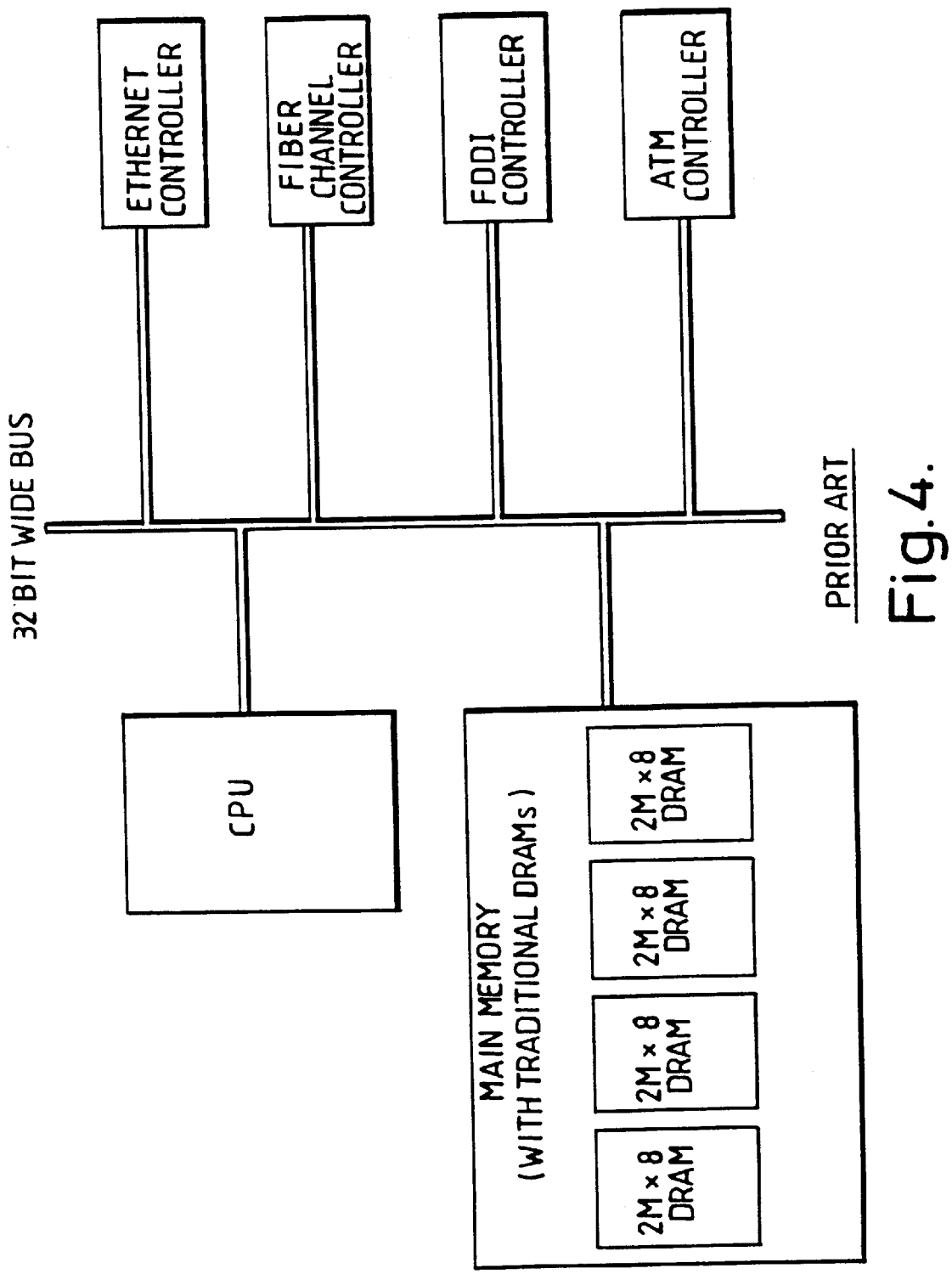
Figure 5:
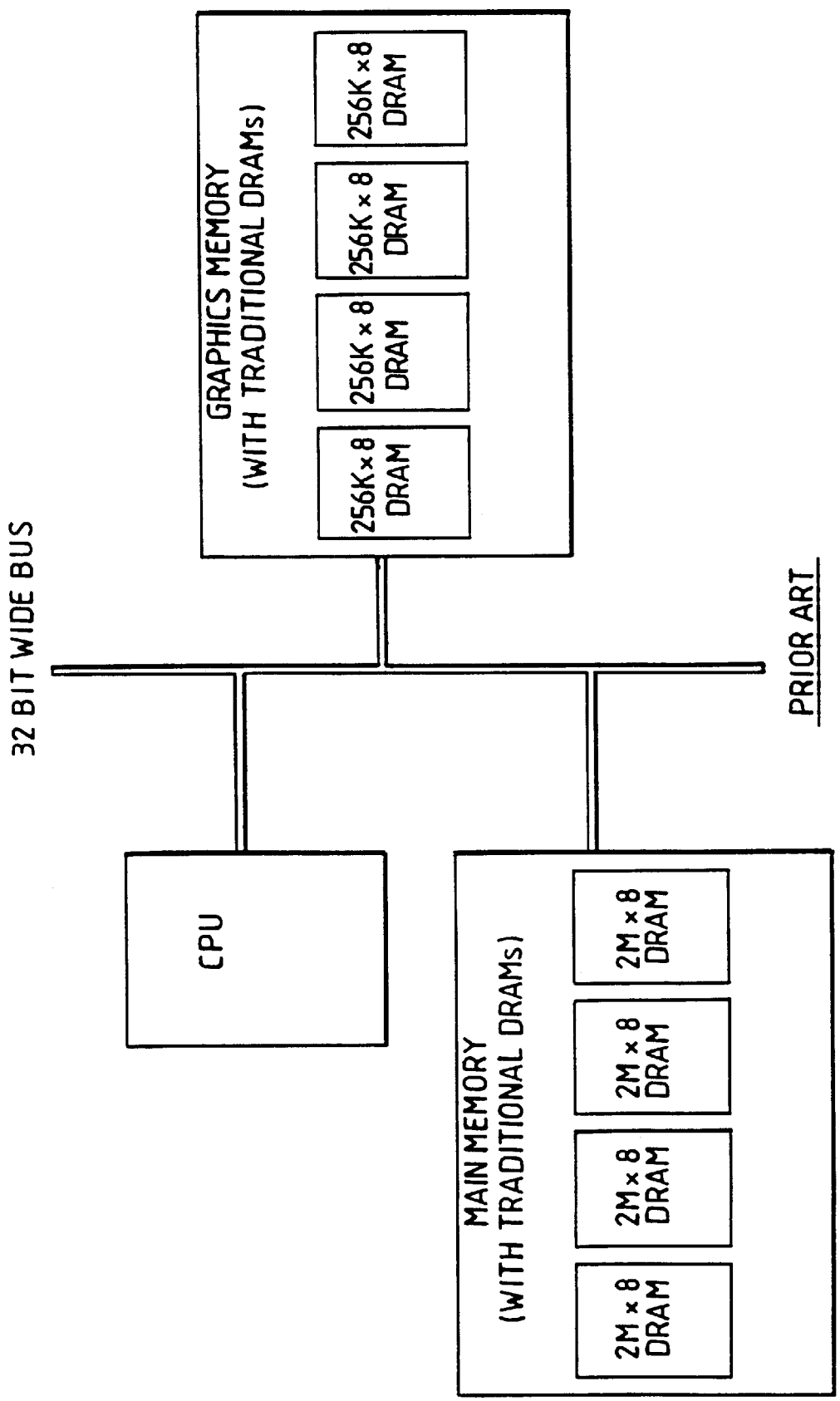
FIG. 5 is a block diagram of a prior art configuration of a graphics application with separate memories and using traditional DRAMs.
Figure 6:
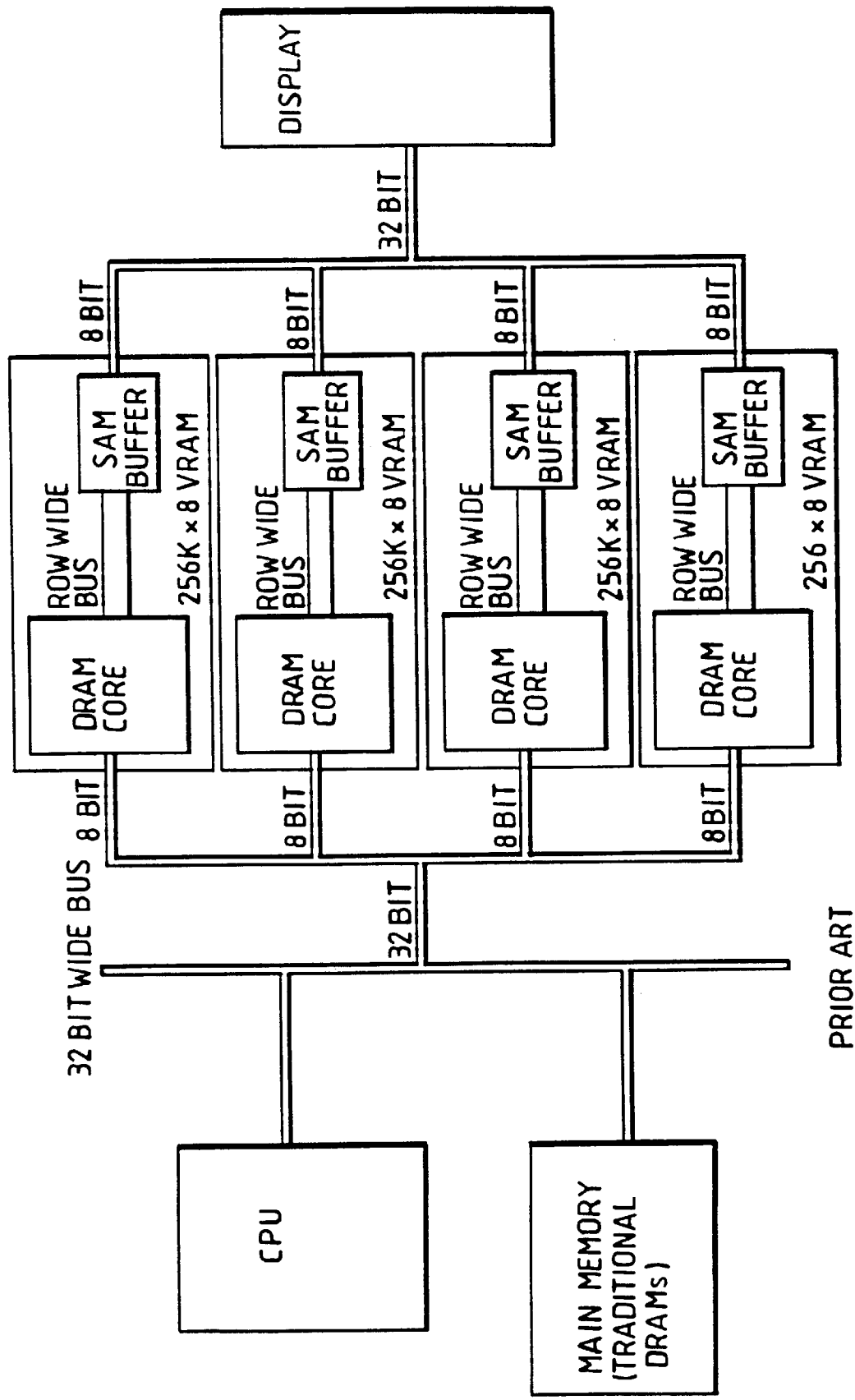
FIG. 6 is similar diagram of a typical architecture of a graphics applications using VRAMs.

Using the earlier example of prior art FIG. 5 where 16 rows of a display need be updated, but this time the DRAM component is 'AMPIC DRAM' of the same 2M×8 size and with two internal banks, each of size 1M×8, and equipped with 'PRITI' capability 16 rows worth of data can be transferred in the new location, with the number of data transfers for the new DRAM being fortuitously precisely the same as the number of rows:

Number of Transfers=Number of rows to be transferred (16).

This again is a vast improvement over the 16384 transfers and associated arbitrations currently required for the conventional DRAM-based designs, and represents a 3 order of magnitude improvement in the performance. It also reduces the impact on the system bandwidth proportionately. In but one row access time, massive amounts of data can be transferred in accordance with the present invention. The novelty of the architecture, both at system and chip level, allow unique DRAM configurations to provide enhanced system performance.

The 'AMPIC DRAM' can also be configured as previously stated to provide the graphics screen data to the display at high speeds.

Consider, for example, the following illustrative parameters applied to the configuration of FIG. 21:

a. 5 serial interfaces are available per chip;

b. 32 bit wide system bus implemented with 4 such chips;

c. 4 serial interfaces per chip have been defined as a port and used to transfer the display data; and d. data retrieval rate per port is at 100 Mhz (can be faster than this rate).

In this example, since 4 serial interfaces per chip are used for graphics, a 16 bit wide graphics interface is implemented, which can provide data at the rate of 2 bytes every clock, thus providing 200 Mbytes per second bandwidth, sufficient for most graphics applications. If the number of I/O resources is expanded, as before discussed, say when, for example, an 'AMPIC DRAM' with 9 serial interfaces is used, the chip could be configured for an 8 bit wide bus to provide an expanded or increased capacity to increase the amount of data to be switched and with more display data bandwidth.

Further Examples of 'AMPIC DRAM'-Based System Configurations

In the example used above, one external bank with a 32 bit wide system bus was used. Some applications, however, may use more than one external bank, such as 4 banks, 32 bit wide each of 'AMPIC DRAM', as shown in FIG. 22. This architecture permits that different network interfaces can be connected to each bank, if so desired. This can increase the network interconnectivity to a much larger level within reasonable cost as compared to the prevailing solutions. As an illustration, if 9 serial interfaces were provided on each 'AMPIC DRAM' and each bank was connected to 4 network interfaces, then a total of 16 networks can be connected. This represents a major gain compared to the existing technology which generally peaks out at 4 to 5 interfaces.

It also follows from this architecture, that when more than one external bank is used, an 'AMPIC DRAM' serial port from one bank can be connected to a serial port of another bank. This provides an added path between banks such that packet buffers can be used to transfer data rapidly between external banks.

It is not necessary, moreover, to use all 'AMPIC DRAMs' in a system configuration. Some applications may mix 'AMPIC DRAMS' with existing type of DRAMs, as proposed in the modifications of FIG. 23.

In still another system configuration, the 'AMPIC DRAM' can be used to provide both the graphics or display interface, as depicted in FIG. 24, and to connect to other types of I/O resources such as, for example, video cameras, or a satellite interface or like.

Unified Memory Architecture

In an ideal world, it would be most advantageous, as before explained, to have a common memory chip for both the graphics and the main memory functions and still provide the necessary performance. This approach dubbed as 'Unified Memory Architecture' (UMA) is currently under intense debate and some proposed solutions have been offered including the before mentioned RDRAM chip. While this proposal uses a smaller number of pins, thus resulting in lower power consumption, smaller real estate and relatively lower cost, the packet based protocol and interface limitations earlier discussed, do not work efficiently as main memory, where accesses tend to be non-localized.

Another potential solution is the use of the previously described VRAMs for both the main memory and graphics memory; but the added cost does not justify the change.

Before the present invention, therefore, unfortunately no reasonable solution has come close to meeting the requirements of the broad cross-section of the PC market.

A system level solution based on the 'AMPIC DRAM' of the invention, previously discussed in connection with the embodiment of FIG. 19, provides the configurable serial interfaces and 'PRITI' capability that certainly fills this void. It has more signal pins (but the number of power and ground pins may be smaller) than the one proposed by the RAMBUS, but less than VRAMs, and is equally efficient at both the operations. With this implementation of the invention, indeed, both the graphics and main memory functions can reside in the same memory with negligible bandwidth reduction and thus meet the elusive goal of the 'Unified Memory Architecture'.

Another alternate embodiment for such solution is to have two internal banks in the chip. One may follow the 'AMPIC' model for graphics or similar applications, while a second internal bank, possibly larger, may resemble the traditional DRAM based main memory, and with both banks sharing the 'PRITI' capability of the invention, as in FIG. 25. This potent integration provides the best of both worlds; one bank appears like main memory, while the other bank appears as an optimized graphics memory. This chip architecture allows massive amounts of data transfers between the two internal banks with very little impact on the system bandwidth due to the 'PRITI' capability, and thus provides all the necessary capabilities needed to allow a common chip and one single bus, universally for all types of applications.

Further improvement to this invention may be made to reduce the pin count and thus cost, if the interface access mechanism of said copending application called 'PARAS' DRAM is used along with the 'AMPIC' organization, as in FIG. 26, to realize a memory chip, optimized for both the requirements: main memory and graphics at the lowest possible cost. Consider the example of a 2M×8 DRAM with 'PARAS' interface, the number of pins saved is 8,which then can be used to provide the serial interfaces. If only 5 serial interfaces are implemented, then the number of pins in this high performance/low cost chip is comparable to the traditional DRAMs, of course with the tremendous additional benefits previously explained. The advantages of such an integrated DRAM are:

a. It provides significantly enhanced system data bandwidth with architectural innovations, rather than sheer device speeds.

b. It is capable of switching the large amount of data amongst multiple I/O resources with minimum impact on the system bandwidth and with expandability.

c. It is configurable to accommodate different data transfer rates of the I/O resources d. It is capable of moving large blocks of data internal to the chip in several orders of magnitude faster time frames and with negligible impact on the system bandwidth.

e. The device has low pin count for the functionality provided.

f. It is relatively low cost due to reduction in the number of pins.

g. Relatively low power consumption is required.

h. The architecture reduces the latency time between the reception of an incoming packet and its subsequent transmission.

i. It interconnects a considerably larger number of I/O resources as compared to the traditional approach.

j. The system design interface is nearly identical to the existing DRAMs, thus minimizing the design cycle.

k. It works equally efficiently for both the main memory and the graphics requirements, thus providing a Unified Memory Architecture.

Further modifications will occur to those skilled in this art including, among others, providing logic to enable off loading the same packet buffer to similarly defined other ports, and the capability to string buffers, or applying the serial interfacing and buffer switching to other memory devices than DRAMS, and such are considered to fall within the spirit and scope of the invention as defined in the appended claims.

What is claimed is:

1. For use in a system for controlling data-accessing of a common bus, an improved DRAM architecture comprising a multi-port internally cached DRAM (AMPIC DRAM) comprising a plurality of independent serial data interfaces each connected between a separate external I/O resources and internal DRAM memory through corresponding buffers competing for access to a common internal bus; a switching module interposed between the serial interfaces and the buffers; and a switching module logic control for the connecting of any of the I/O resources through serial interfaces with any of the buffers under a dynamic configuration of switching allocation as appropriate for the desired data routability among the interfaces wherein the number of the serial interfaces is independent of the number of buffers and the number of serial interfaces varies under the dynamic configuration.

2. A system as claimed in claim 1 and in which the switching module comprises one or more multiplexers or cross bar switches, or a combination thereof.

3. A system as claimed in claim 1 and in which the said memory is the DRAM core main memory of the system.

4. A system as claimed in claim 1 and in which the AMPIC DRAM switching module assigns any buffer to any serial interface and without any intermediate step of data transfer.

5. A system as claimed in claim 1 and in which each independent serial interface is one bit wide.

6. A system as claimed in claim 5 and in which multiple one bit wide serial interfaces are configured with a common I/O resource as a narrow width bus or port, connected to a common buffer.

7. A system as claimed in claim 6 and in which, each buffer has the capability to interface with up to all the serial interfaces simultaneously when defined as a port, and with each buffer configured for the same port size as the port to which it is connected or docked.

8. A system as claimed in claim 1, and in which a plurality of AMPIC DRAM switching chips is provided, each connected between the bus interface and an I/O resource serial interface and with one or multiple serial interfaces serving as a port therewith.

9. A system as claimed in claim 1 wherein means is provided whereby one or both of the number of I/O resources used and the number of AMPIC DRAM switching chips used is increased respectively to expand the amount of data to be switched and the internal data switching capacity due to the effective corresponding increase in internal bus size.

10. A system as claimed in claim 1 wherein means is provided whereby one or both of the number of I/O resources and the number of AMPIC DRAM switches used is varied correspondingly to vary the amount of data to be switched, and the internal data switching capacity due to the effective corresponding variation in internal bus size; respectively.

11. In a system using one or more memory-equipped DRAM units or banks of DRAM units requiring controlling data-accessing of a common bus, a method of obviating DRAM system bandwidth limitations, materially increasing data transfer speed, materially reducing bus arbitration requirements, enabling increased I/O resource interfacing and at reduced cost and lower power consumption, that comprises, equipping each DRAM unit with at least one supplemental serial data port for interfacing through a corresponding serial interface with an external I/O data resource; providing internally of each DRAM a buffer for each of the serial interfaces competing for access to a common internal bus; interposing a switching module between the buffers and the serial interfaces; and causing the connecting of any of the serial interfaces to any of the buffers by dynamically configuring the switching of the switching module as appropriate for the desired data routability among the interfaces, wherein the number of the serial interfaces is independent of the number of buffers and the number of serial interfaces varies under the dynamic configuration.

12. The method as claimed in claim 11 and in which the switching is effected by multiplexing or cross bar switching or both.

13. The method as claimed in claim 11 and in which said switching assigns buffers to any serial interface and without any intermediate step of transferring data between the buffers and the DRAM memory.

14. The method as claimed in claim 11 wherein the number of I/O resources is varied correspondingly to vary the amount of data presented to be switched via the internal bus.

15. The method as claimed in claim 11 wherein the number of AMPIC DRAM switches is varied correspondingly to vary the available effective internal bus capacity and the resulting internal data switching capacity of the system.

* * * * *